(12) United States Patent
Morel et al.

(10) Patent No.: US 6,258,620 B1
(45) Date of Patent: Jul. 10, 2001

(54) METHOD OF MANUFACTURING CIGS PHOTOVOLTAIC DEVICES

(75) Inventors: Don Louis Morel, Tampa, FL (US); Syed Arif Zafar, Santa Barbara, CA (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 09/172,810

(22) Filed: Oct. 15, 1998

Related U.S. Application Data

(60) Provisional application No. 60/062,467, filed on Oct. 15, 1997.

(51) Int. Cl.[7] .............................. H01L 21/00; B05D 5/12
(52) U.S. Cl. ................................. 438/57; 438/85; 427/76
(58) Field of Search .................................. 438/57, 85, 48; 427/76, 74

(56) References Cited

U.S. PATENT DOCUMENTS

| | | |
|---|---|---|
| 3,607,699 | 9/1971 | Sosniak . |
| 3,716,844 | 2/1973 | Brodsky . |
| 3,869,322 | 3/1975 | Cuomo et al. . |
| 3,915,764 | 10/1975 | Noreika et al. . |
| 3,956,025 | 5/1976 | Statz et al. . |
| 3,979,629 | 9/1976 | Statz et al. . |
| 3,983,574 | 9/1976 | Statz et al. . |
| 4,448,633 | 5/1984 | Shuskus . |
| 4,712,220 | 12/1987 | Luft . |
| 4,915,745 | 4/1990 | Pollock et al. . |
| 5,436,204 | 7/1995 | Albin et al. . |
| 5,445,847 * | 8/1995 | Wada et al. .......................... 427/74 |
| 5,578,502 * | 11/1996 | Albright et al. ...................... 437/4 |
| 5,626,688 | 5/1997 | Probst et al. . |
| 5,674,555 * | 10/1997 | Birkmire et al. .................... 427/76 |
| 5,804,054 * | 9/1998 | Bhattacharya et al. .............. 205/239 |
| 6,048,442 * | 4/2000 | Kushiya et al. .................... 204/192.28 |

OTHER PUBLICATIONS

"Manufacturing–Compatible Methods for the Formation of Cu(In,Ga)Se$_2$ Thin Films" by Gabor, et al., 25th PVSC, May 13–17, 1996, Washington, D.C., pp. 889–892.

(List continued on next page.)

*Primary Examiner*—Vu A. Le
*Assistant Examiner*—Adam Pyonin
(74) *Attorney, Agent, or Firm*—Calfee, Halter & Griswold LLP

(57) ABSTRACT

A method of manufacturing copper-indium-gallium-diselenide (CuIn$_x$Ga$_{1-x}$Se$_2$ or just CIGS) photovoltaic devices using elemental selenium and without requiring complex codeposition or requiring the use of toxic H$_2$Se gas. A precursor taking one of several forms is deposited onto a substrate having a back contact. A first precursor includes copper, gallium, and indium, the latter of which is deposited in the presence of a selenium flux, all deposited in that order. The second precursor includes indium deposited in the presence of a selenium flux, copper, and gallium, deposited in that order. Next, the precursor is selenized using one of two techniques: an indium-gallium removal technique and a copper-top technique. In both techniques, the precursor is heated to and held at a first selenization temperature, most preferably 450° C., and then heated to and held at a second selenization temperature, most preferably 550° C. In the indium-gallium removal technique, the heating stages and the first hold are done in a selenium flux that is relatively constant and the selenium flux is decreased to zero during the second hold stage. In the copper-top technique, additional copper is added during the first or second hold stages; both heating stages and both hold stages are done in a selenium flux that is relatively constant and the selenium flux is decreased to zero afterwards during a cooling stage.

36 Claims, 8 Drawing Sheets

OTHER PUBLICATIONS

"Gallium Content Enhancement In $CuIN_{1-x}Ga_xSe_2$ Thin Films Prepared by Two–Selenizations Process Using Se Vapor" by Dhere, eta l., 25th PVSC, May 13–17, 1996, Washington, D.C., pp. 897–900.

"New Aspects of Phase Segregation and Junction Fomration in $CuInSe_2$" by Herberholz, et al., 26th PVSC, Sep. 30–Oct. 3, 1997, Anaheim, CA., pp. 323–326.

"Effect of Reduced Deposition Temperature, Time, and Thickness on $Cu(In,Ga)Se_2$ Films and Devices" by Shafaman, et al., 26th PVSC, Sep. 30–Oct. 3, 1997, Anaheim, CA., pp. 331–334.

"Pilot Production of Cigs Photovoltaic Modules" by Britt, et al., 26th PVSC, Sep. 30–Oct. 3, 1997, Anaheim, CA., pp. 335–338.

* cited by examiner

METHOD OF MANUFACTURING CIGS PHOTOVOLTAIC DEVICES

This claims priority from Provisional Application No. 60/062,467, filed Oct. 15, 1997.

FIELD OF THE INVENTION

The present invention relates generally to photovoltaic cells and, more specifically, to a method of manufacturing copper-indium-gallium-diselenide ($CuIn_xGa_{1-x}Se_2$ or just CIGS) photovoltaic devices using elemental selenium and without requiring complex codeposition or requiring the use of toxic $H_2Se$ gas.

BACKGROUND OF THE INVENTION

There is a growing consensus that the collection of solar energy and its conversion to electrical energy by means of photovoltaic devices should be included in the energy mix of the near future. The commercialization of photovoltaic devices depends on technological advances that lead to higher efficiencies, lower cost, and stability of such devices. The cost of electricity can be significantly reduced by using solar modules constructed from inexpensive thin film polycrystalline semiconductors such as copper indium diselenide ($CuInSe_2$ or CIS) or cadmium telluride (CdTe). Both materials have shown great promise, but certain difficulties have to be overcome before their commercialization.

Thin-film photovoltaics have two important advantages that offer the hope of achieving truly low-cost electricity production in the near future. The first key to using thin-film photovoltaics is that the material costs remain a small part of the total cell cost and the thin-film coating on large substrates can be obtained in sufficiently large volumes and at sufficiently low costs. The second key to using thin-film photovoltaics is that they hold the promise of being mass-produced in automated processing lines. Two of the leading candidates among thin film solar cells are cadmium telluride and copper indium diselenide. These thin film solar cells are developed with very simple and inexpensive processing techniques such as closed space sublimation (CSS), evaporation, and sputtering, on inexpensive window glass which also acts as a structural support for the final modules. Besides the reduced material cost, simpler and less expensive processing and simpler handling allow for a significant reduction in cost over crystalline silicon cells. However, problems also exist, slowing the thin film solar cell technology in its development and commercial use. A generic problem that is associated with all thin film solar cells is their low conversion efficiencies. The thin-film semiconductor layers are polycrystalline in nature. The inherent grain boundaries introduce regions of increased disorder and segregated impurities in large densities, resulting in a loss of photogenerated carriers due to increased recombination rates. Nevertheless, there has been continuous progress in achieving higher thin-film solar cell efficiencies during recent years despite the poor photovoltaic properties of compound materials developed by low-cost processing methods.

Gallium has been used beneficially in CIS devices, resulting in a copper-indium-gallium-diselenide ($CuIn_xGa_{1-x}Se_2$ or just CIGS) structure. Gallium helps to improve the adhesion properties of the CIS films to the substrate. Also, by engineering the band gap of the CIS through Ga incorporation in the space charge region, device efficiencies have been improved further. CIGS laboratory solar cells with efficiencies in the 15–17% range have been reported by several organizations.

However, the deposition techniques used to achieve these levels of performance are either complex codeposition or a two-step process of deposition of a precursor followed by selenization with $H_2Se$ gas. Each of these methods has shortcomings relative to manufacturing scale-up. The codeposition technique requires tight control of the elemental sources and is quite complicated. The two-step process relaxes this issue but adds the difficulty of dealing with $H_2Se$ gas, a class A toxic gas, the use of which significantly adds to the complexity of using this method. Attempts at simplifing CIGS manufacturing techniques, for example, by depositing a precursor of one or more of copper, gallium, selenium, and indium and then "selenizing" that precursor by heating it in the presence of a selenium flux, have not resulted in conversion efficiencies as high as ultimately expected from such techniques.

Also, ideally, an absorber layer of a photovoltaic device must have a good bulk layer (e.g., values of space charge width of about 0.5 $\mu$m and a minority carrier diffusion length of 1–2 $\mu$m) and must have a good absorber surface (e.g., low defect density resulting in a recombination lifetimes preferably on the order of $5 \times 10^{-9}$ seconds or greater). Many prior art techniques focus on a manufacturing process that is an apparent compromise between achieving a good bulk layer and achieving a good absorber surface. The result is that neither the surface properties nor the bulk properties are optimized; the process is too complex to simultaneously optimize both properties at the current state of technology.

SUMMARY OF THE INVENTION

According to the present invention, CIGS devices having good conversion efficiencies (about 13%) are manufactured without using $H_2Se$ by first preparing a precursor and then performing a selenization step in which the precursor is heated in the presence of a selenium flux using elemental selenium as a selenium source. Different embodiments for both the precursor formation step and the selenization step are presented herein. In particular embodiments of practicing the method of the present invention, preferably a precursor containing copper, gallium, indium, and selenium is deposited onto a back contact. The copper is preferably deposited separately from the gallium, which is preferably deposited separately from the indium, which is preferably deposited in the presence of a selenium flux. This precursor is then converted into a p-type absorber layer during the selenization step in which the precursor is preferably heated in the presence of a selenium flux. The selenization step more preferably includes a two-step heating process in which the precursor is heated at a first temperature for a period of time and then heated a second temperature that is higher than the first temperature for a period of time.

An embodiment of the method of manufacturing a photovoltaic device according to the present invention includes the following steps:

(a) providing a substrate carrying a back electrode;

(b) forming a precursor on the back electrode by depositing at least one Class IB element, at least one Class IIIA element, and at least one Class VIA element on the back contact, with an atomic ratio of deposited Class IB elements to deposited Class IIIA elements in the precursor of not greater than 1.0;

(c) heating the precursor in the presence of a flux of at least one Class VIA element thereby creating a partially completed absorber layer;

(d) depositing an additional amount of at least one Class IB element onto the partially completed absorber layer, thereby changing the atomic ratio of deposited Class IB elements to deposited Class IIIA elements; and (e) heating the partially completed absorber layer with its additional amount of Class IB element in the presence of a flux of at least one Class VIA element.

According to particular embodiments of the present invention, the precursor is formed by depositing the copper, gallium, and indium, the latter of which is preferably deposited in the presence of a selenium flux, in various orders. In a first embodiment (PI) of the precursor formation step above (step (b)), copper is deposited onto the back contact, gallium is deposited onto the copper, and then indium is deposited onto the gallium in the presence of a selenium flux.

In a second embodiment (PII) of the precursor formation step above (step (b)), indium is deposited onto the back contact in the presence of a selenium flux forming a layer of indium selenide, gallium is deposited onto the layer of indium selenide, and then copper is deposited onto the gallium. Other precursors can be used, for example, several PI sequences or several PII sequences can be deposited onto the same substrate. The PI precursor has provided devices having a conversion efficiency of about 13.0%. The PII precursor has provided devices having a conversion efficiency of about 10.2%.

In a first embodiment of the selenization step above (steps (c), (d), and (e)), the precursor is selenized by heating in the presence of a selenium flux with the deposition of additional copper to the top of the structure. Since additional copper is added to the top during selenization, this first technique is referred to as the "copper-top technique." In an alternative selenizing embodiment, the precursor is selenized by heating in the presence of a selenium flux without the addition of additional copper, gallium, or indium. Since this process results in the removal of indium and/or gallium, it is referred to as the "indium-gallium removal technique." More preferably, both the indium-gallium removal technique and the copper-top technique preferably utilize a two-stage heating process in which a precursor is heated to a first temperature for a period of time and then heated to a second, higher, temperature for a period of time, both in the presence of a selenium flux.

Both selenization techniques preferably use elemental selenium as a source of selenium and neither technique requires the use of toxic $H_2Se$ gas. When PI precursors are employed, the indium-gallium removal technique has produced devices having a conversion efficiency of about 10.2%. When PII precursors are employed, the indium-gallium removal technique has produced devices having a conversion efficiency of about 10.2%. When PI precursors are used, the copper-top technique has produced devices having a conversion efficiency of about 13.0%. When PII precursors are used, the copper-top technique has produced devices having a conversion efficiency of about 10.0%.

Importantly, the present invention has broader application also. The selenization method of the present invention uses separate optimization of bulk and surface properties of the absorber layer; first the bulk properties are optimized and then, as a separate step, the surface properties are optimized. In particular, the two-stage heating in a selenium flux during selenization according to the present invention separates the optimization of the bulk and surface properties. The first heating stage of heating in a selenium flux according to the present invention tends to improve the bulk properties of the absorber layer and the second heating stage of heating in a selenium flux at a higher temperature according to the present invention tends to optimize the surface properties of the absorber layer.

It is therefore an advantage of the method of the present invention to provide CIGS photovoltaic devices having relatively high conversion efficiencies without requiring complex codeposition or toxic $H_2Se$ gas.

It is a further advantage of the method of the present invention to provide a semiconductor device requiring good bulk properties and good surface properties by first optimizing the bulk properties and then separately optimizing the surface properties without significantly altering the bulk properties.

These and other advantages of the present invention will become more apparent from a detailed description of the invention.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below serve to example the principles of this invention.

DETAILED DESCRIPTION OF THE PREFERRED EMBODIMENT

Figure 1A:
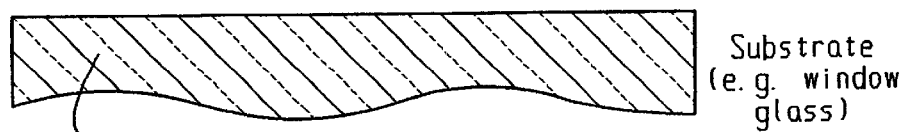
FIGS. 1a–1j are a series of schematic cross-sectional views of a first embodiment of a photovoltaic device constructed in accordance with a first embodiment of the method of the present invention.

While the present invention will be described more fully hereinafter with reference to the accompanying drawings, in which a device produced in accordance with a preferred embodiment of the method of the present invention is shown, it is to be understood at the outset of the description which follows that persons of skill in the appropriate arts may modify the invention here described while still achieving the favorable results of this invention. Accordingly, the description that follows is to be understood as being a broad, teaching disclosure directed to persons of skill in the appropriate arts, and not as a limitation on the present invention.

The term "Class X element" as used herein means an element of Class X of the Periodic Table of the Elements. Thus, the term "Class IB element" means an element of Class IB of the Periodic Table of the Elements (for example, copper, silver, and gold), the term "Class IIIA element" means an element of Class IIIA of the Periodic Table of the Elements (for example, indium, gallium, and boron, aluminum, and thallium), the term "Class VIA element" means an element of Class VIA of the Periodic Table of the Elements (for example, selenium, sulfur, oxygen, tellurium, and polonium), and the term "Class VIB element" means an element of Class VIB of the Periodic Table of the Elements (for example, molybdenum, chromium, and tungsten).

The term "deposit" and its other forms (e.g., "deposited," "deposition," and "depositing") is intended to encompass all forms of putting down or laying down one or more elements or compounds onto a surface. By way of example, the depositing steps herein include vacuum chamber deposition processes such as sputtering (RF sputtering, DC sputtering, magnetron sputtering, and the like), evaporation (standard evaporation, electron beam evaporation, and the like), laser ablation, and the like, as well as including other processes such as electrodepositing, electroplating, chemical vapor deposition, spraying, and the like. The depositing steps herein more preferably include vacuum chamber deposition processes such as sputtering (RF sputtering, DC sputtering, magnetron sputtering, and the like), evaporation (standard evaporation, electron beam evaporation, and the like), laser ablation, and the like, and most preferably include depositing copper, indium, and selenium by standard evaporation and depositing gallium by sputtering.

Gallium is preferably deposited by sputtering from a pure gallium source. Since gallium typically is in a liquid state for the deposition conditions used herein, special provision must be made to sputter gallium. The gallium sputtering source preferably consists of a container that contains liquid gallium during the sputtering process. The container is preferably a shallow container and is more preferably a shallow container made of copper. The container can be made from a standard 3" diameter, 0.25" thick copper sputtering target. To make the container from a sputtering target, the center of the upper surface of the copper sputtering target is preferably machined out to provide a shallow reservoir for containment of the liquid gallium. To sputter gallium onto a substrate, first the container is provided and placed into the sputter chamber. The gallium sputtering head (the surface upon which the gallium source rests; also known as a sputtering gun) must be level to provide a suitable gallium sputter source. One suitable way to level the sputtering head is to pour liquid gallium into the shallow container and begin the sputtering process. If the head and container are not level, gallium will move or spill over the lip of the container, indicating the low end of the head. By repeatedly adjusting the level of the head, then sputtering gallium, and then observing any spilling of or change in location of the gallium, the head can be leveled so that the gallium does not move when sputtered. Once the sputtering head is level, liquid gallium is then poured into the container to a level to cover the bottom of the container with gallium, but not so high as to allow the liquid gallium to creep up the sides of the container. With this gallium source, gallium can be sputtered in the usual manner. More specifically, if the substrate heater was on for any previous deposition steps, for example, to heat the substrate to about 275° C. for deposition of copper or deposition of indium in a selenium flux, then the substrate heater is turned off for the gallium RF sputtering step to prevent any possible interference between the substrate heater and the RF sputtering process. If the deposition chamber was not pumped down to a vacuum in connection with the previous deposition step, it is done so next. Argon is then admitted into the chamber to raise the pressure to about 5 milliTorr. With argon flowing into the chamber, the RF power level on the sputter system is adjusted and then turned on to give a gallium deposition rate of about 1.0 Å/s. Once the desired thickness of gallium has been deposited, the RF power is turned off and then the argon flow is turned off (assuming the next deposition step does not use a flow of argon). The substrate heater power can then be applied or reapplied to raise the substrate temperature to a desired temperature for the next deposition step.

Figure 1B:
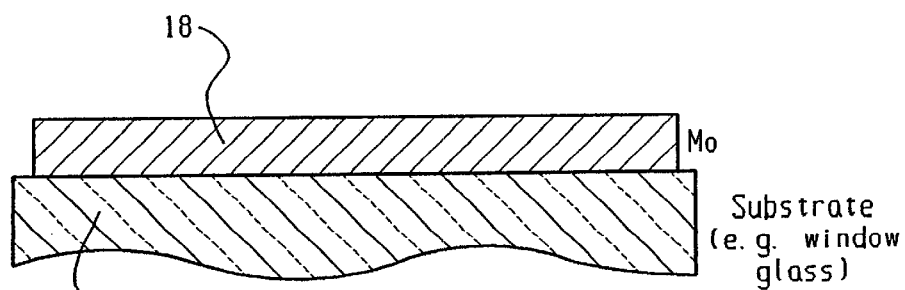
Figure 1C:
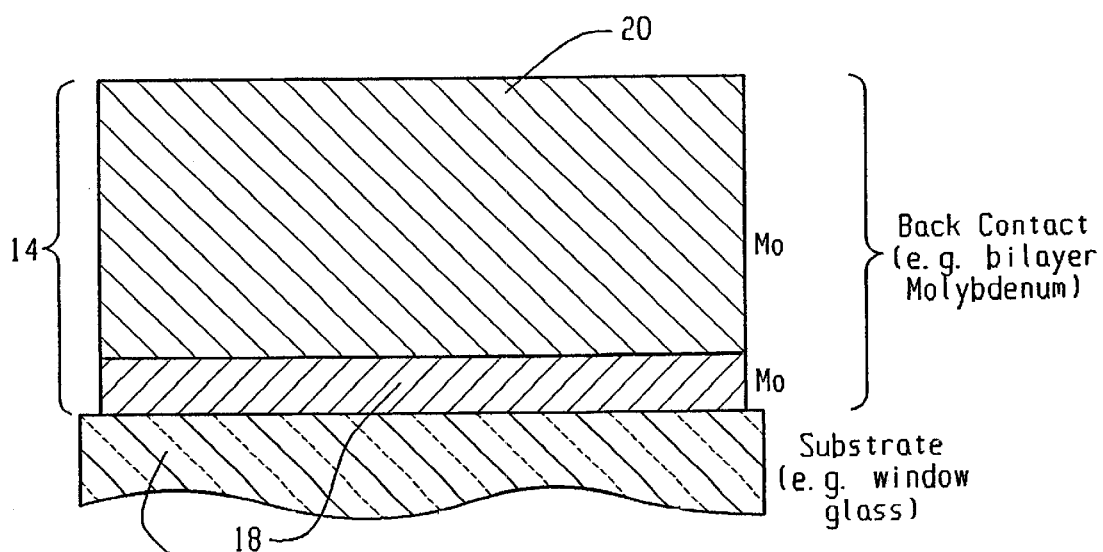
Figure 1D:
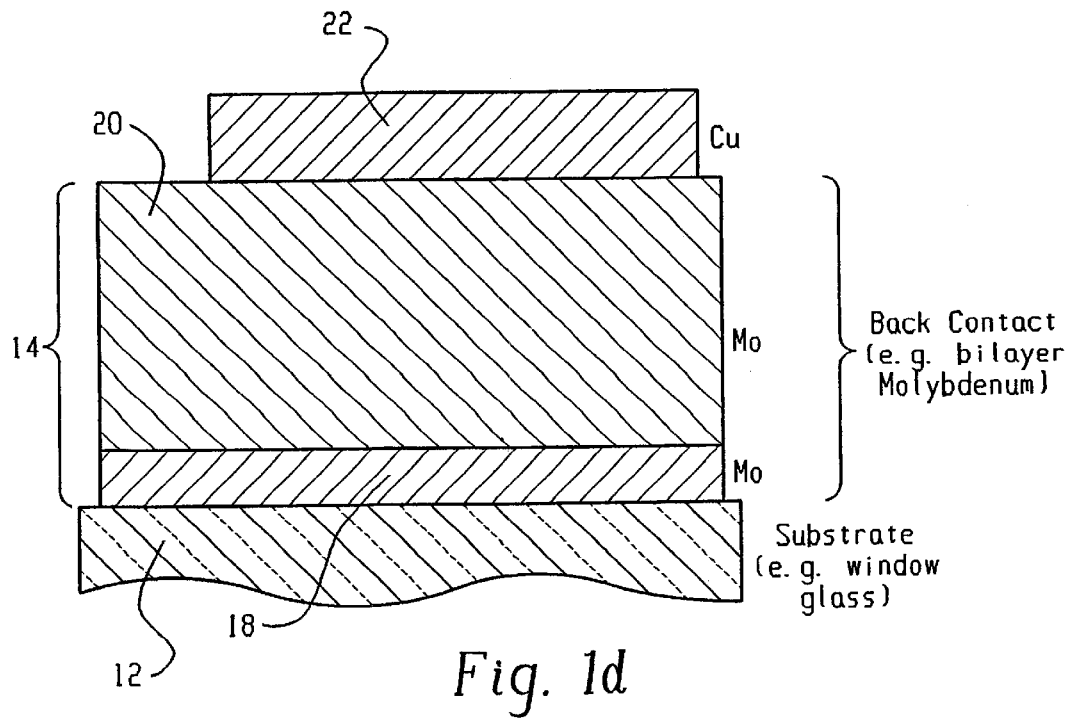
Figure 1E:
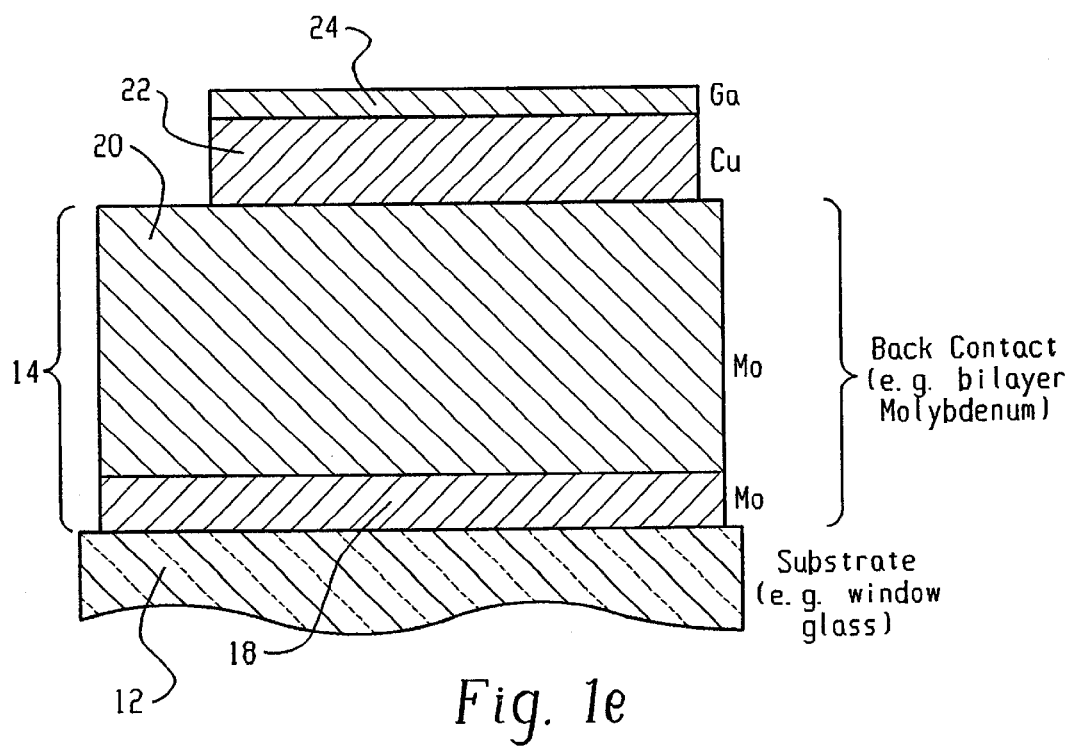
Figure 1F:
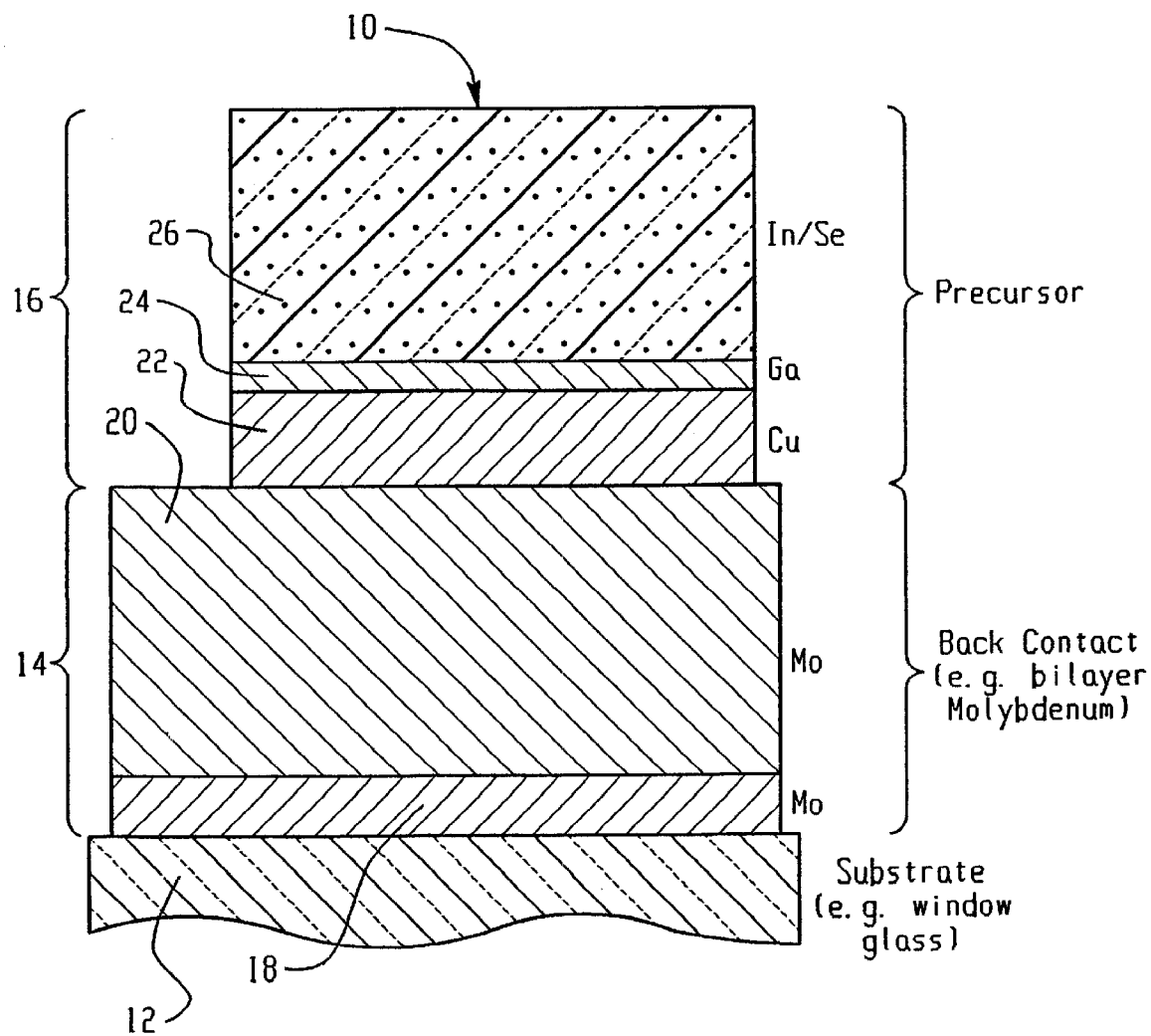

Referring now more particularly to the accompanying drawings, an intermediate structure for a photovoltaic device produced according to one embodiment of the method of the present invention is shown and generally indicated at 10 (FIG. 1f). The intermediate structure 10 includes a substrate 12, a back contact 14, and a precursor 16. The substrate 12 is preferably common window glass, i.e., soda-lime glass, and can also be any of the other materials commonly known to be suitable as photovoltaic device substrates, for example, one of many ceramics. The back contact 14 forms an electrical contact along the back of the device and is preferably a bilayer molybdenum film that is about 1 micron thick, but can also be made of other materials, for example, tungsten and chromium. The preferred bilayer molybdenum film 14 preferably comprises a first layer of molybdenum 18 and a second layer of molybdenum 20. The first layer of molybdenum 18 is preferably a relatively thin layer deposited at relatively high pressure and the second layer of molybdenum 20 is preferably a thicker layer deposited at relatively low pressure. The precursor 16 preferably comprises separately deposited elements or combinations of elements used to form an absorber layer in the photovoltaic device, for example, copper, gallium, indium, and selenium, deposited onto the back contact 14. In the example of FIG. 1f, the precursor 16 comprises copper 22 deposited onto the back contact 14, gallium 24 deposited onto the copper 22, and indium deposited in the presence of a selenium flux (indicated as 26) onto the gallium 24.

More specifically, first the substrate 12 (FIG. 1a) is selected and prepared. This preferably includes selecting a piece of substrate of an appropriate size and thoroughly cleaning the substrate. In the context of the examples, the preparation of the substrate most preferably includes selecting a piece of soda-lime glass that is shaped substantially in the shape of a square that is about 10 cm by about 10 cm in size and is free from scratches and other macroscopic defects; washing the substrate in a solution of detergent and deionized water; rinsing the washed substrate several times in deionized water; immersing and agitating the washed and rinsed substrate in an ultrasonic agitator containing trichlorotrifluoroethane; re-rinsing by suspending the washed, rinsed, and agitated substrate in a hot deionized water rinse with nitrogen gas bubbled through the hot water; and drying the washed, rinsed, agitated, and re-rinsed substrate by heating the substrate.

Next, the back contact 14 is deposited onto the prepared substrate 12. This preferably includes depositing a thin film of one of the Class VIB elements, for example, molybdenum, onto the prepared substrate 12. Most preferably a bilayer molybdenum film is sputtered onto the prepared substrate 12. The bilayer molybdenum film is preferably deposited in a DC magnetron sputtering system by sputtering a first layer of molybdenum 18 (FIG. 1b) that is about 1250 angstroms thick onto the prepared substrate at argon pressure of about five milliTorr in the chamber and then sputtering a second layer of molybdenum 20 (FIG. 1c) that is about 9000 angstroms thick onto the first layer of molybdenum 18 at argon pressure of about 1.5 milliTorr in the chamber. The argon pressure at which the first layer of molybdenum 18 is deposited is preferably in the range of between 4.5 and 5.5 milliTorr. The thickness of the first layer of molybdenum 18 is preferably in the range of between about 1200 and 1300 angstroms. The argon pressure at which the second layer of molybdenum 20 is deposited is most preferably about 1.5 milliTorr. The thickness of the second layer of molybdenum 20 is most preferably about 9000 angstroms. In the examples, the substrate is then preferably cut into square pieces measuring approximately 5 cm by 5 cm; one of which is used for the rest of the process.

Next, the precursor 16 is deposited onto the back contact 14. This preferably includes depositing at least one Class IB element (e.g., copper), at least one Class IIIA element (e.g., indium and gallium), and at least one Class VIA element (e.g., selenium), onto the back contact 14 and more preferably includes separately performing the steps of (i) depositing at least one Class IB element (e.g., copper), (ii) depositing at least one Class IIIA element (e.g., gallium), and (iii) depositing at least one Class IIIA element (e.g., indium), in the presence of a flux of at least one Class VIA element (e.g., selenium), onto the back contact 14 or each other.

There are several embodiments for the precursor. As shown in FIG. 1f, one precursor (PI) has a copper/gallium/indium in a selenium flux (Cu/Ga/In—Se) sequence and is made by (i) depositing copper 22 onto the back contact 14 (FIG. 1d), then (ii) depositing gallium 24 onto the copper 22 (FIG. 1e), and then (iii) depositing indium in the presence of a selenium flux (indicated by 26) onto the gallium 24 (FIG. 1f). In another embodiment, the precursor (PII; not shown) has an indium in a selenium flux/copper/gallium (In—Se/Cu/Ga) sequence and is made by (i) depositing indium in the presence of a selenium flux onto the back contact 14, then (ii) depositing copper onto the indium deposited in the presence of a selenium flux, and then (iii) depositing gallium onto the copper. For either embodiment, any or all of the separate steps can result in distinct layers, or can result in distinct layers in combination with partially diffused layers, but they need not result in one or the other. In the alternative to using one of each sequence (e.g., only Cu/Ga/In—Se (PI) or only In—Se/Cu/Ga (PII)) to form the precursor 16, multiple layers of one sequence or the other (e.g., Cu/Ga/In—Se/Cu/Ga/In—Se (PI—PI) or In—Se/Cu/Ga/In—Se/Cu/Ga (PII—PII)) can be deposited to form the precursor 16.

The PI precursor 16 is preferably deposited as follows. First the substrate 12 with its associated back contact 14 is heated preferably in a pure argon gas atmosphere to a precursor deposition temperature preferably above 200° C., more preferably above 250° C., even more preferably from about 255° C. to about 295° C., even more preferably from about 265° C. to about 285° C., even more preferably from about 270° C. to about 280° C., and most preferably to about 275° C. With the temperature of the substrate 12 and back contact 14 held at the precursor deposition temperature, copper 22 is evaporated from the copper source 30 (FIGS. 2a and 2b) onto the bilayer molybdenum film 14. Then gallium 24 is sputtered from the gallium target 32 onto the copper 22. Then indium is deposited in the presence of a selenium flux onto the gallium by coevaporating the indium source 34 and the selenium source 36, such that the ratio of selenium flux to indium flux during deposition is preferably above 2.0, more preferably above 3.0, and most preferably about 5. The actual value of selenium flux is preferably above 16 Å/s (all selenium flux values are as measured by the second thickness monitor 62, FIG. 2b, which is a thickness monitor positioned as described in Example 1) and more preferably about 25 Å/s. Indium is deposited in the presence of a selenium flux until the atomic ratio of deposited copper to deposited indium and gallium in the precursor is preferably between about 1.25 and about 0.69, more preferably between about 1.0 (but not greater than 1.0) and about 0.8, and is most preferably between about 1.0 (but not greater than 1.0) and about 0.9. In the alternative to depositing the copper, gallium, indium, and selenium all at the precursor deposition temperature, discussed above, the copper and gallium are deposited at a temperature preferably from about room temperature to about 200° C., more preferably from about room temperature to about 250° C., and most preferably from about room temperature to about 275° C. The indium is deposited in the presence of a selenium flux with the substrate preferably from about 255° C. to about 295° C., even more preferably from about 265° C. to about 285° C., even more preferably from about 270° C. to about 280° C., and most preferably at about 275° C.

The PII precursor is preferably deposited as follows. First, the substrate 12 with its associated back contact 14 is heated in a pure argon gas atmosphere to a precursor deposition temperature preferably to above 200° C., more preferably to above 250° C., even more preferably from about 255° C. to about 295° C., even more preferably from about 265° C. to about 285° C., even more preferably from about 270° C. to about 280° C., and most preferably to about 275° C. With the temperature of the substrate 12 and back contact 14 held at the precursor deposition temperature, indium is deposited in the presence of a selenium flux onto the gallium by coevaporating the indium source 34 (FIGS. 2a and 2b) and the selenium source 36 such that the ratio of selenium flux to indium flux is preferably above 2.0, more preferably above 3.0, and most preferably about 5. The actual value of selenium flux is preferably above 16 Å/s and more preferably about 25 Å/s. With the temperature of the substrate 12 and back contact 14 still at the precursor deposition temperature, copper is evaporated from the copper target 30 onto the indium and selenium. Then gallium is sputtered from the gallium target onto the copper until the atomic ratio of deposited copper to deposited indium and gallium in the precursor is preferably between about 1.25 and about 0.69, more preferably between about 1.0 (but not greater than 1.0) and about 0.8, and is most preferably between about 1.0 (but not greater than 1.0) and about 0.9. In the alternative to depositing the copper, gallium, and indium in the presence of a selenium flux to form the PII precursor, all at the precursor deposition temperature, discussed above, the copper and gallium are deposited at a temperature preferably from about room temperature to about 200° C., more preferably from about room temperature to about 250° C., and most preferably from about room temperature to about 275° C. The indium is deposited in the presence of a selenium flux with the substrate preferably from about 255° C. to about 295° C., even more preferably from about 265° C. to about 285° C., even more preferably from about 270° C. to about 280° C., and most preferably at about 275° C.

Whichever precursor is used, the next step is to "selenize" the precursor, which herein is used to mean heating the precursor in the presence of a selenium flux, as compared to using $H_2Se$ gas. The selenizing step allows the separately deposited copper, gallium, and indium selenide to form the p-type $CuIn_xGa_{1-x}Se_2$ absorber layer, which is one of the essential components of the thin film photovoltaic device. One aspect of the present invention is the individual optimization of surface and bulk properties of the absorber region, as will be explained below.

According to the present invention there are two basic selenization methods: an indium-gallium removal technique and a copper-top technique. In the indium-gallium removal technique, the precursor is selenized (heated in the presence of a selenium flux) without the addition of additional copper, gallium, or indium, which results in the removal of excess indium and/or gallium at the surface, thereby improving the surface properties of the CIGS layer. In the copper-top technique, the precursor is selenized (heated in the presence of a selenium flux) with the deposition of additional copper (or in the alternative additional gallium or indium) to the top of the structure during selenization, which additional copper (or in the alternative additional gallium or indium) bonds with the excess indium and gallium at the surface, thereby improving the surface properties of the CIGS layer. With respect to the copper-top technique, after depositing all of the copper the final atomic ratio of deposited copper to deposited indium and gallium in the precursor is preferably between about 1.0 (but not greater than 1.0) and about 0.8, is more preferably between about 1.0 (but not greater than 1.0) and about 0.9, and is most preferably about 1.0 (but not greater than 1.0).

Figure 3:
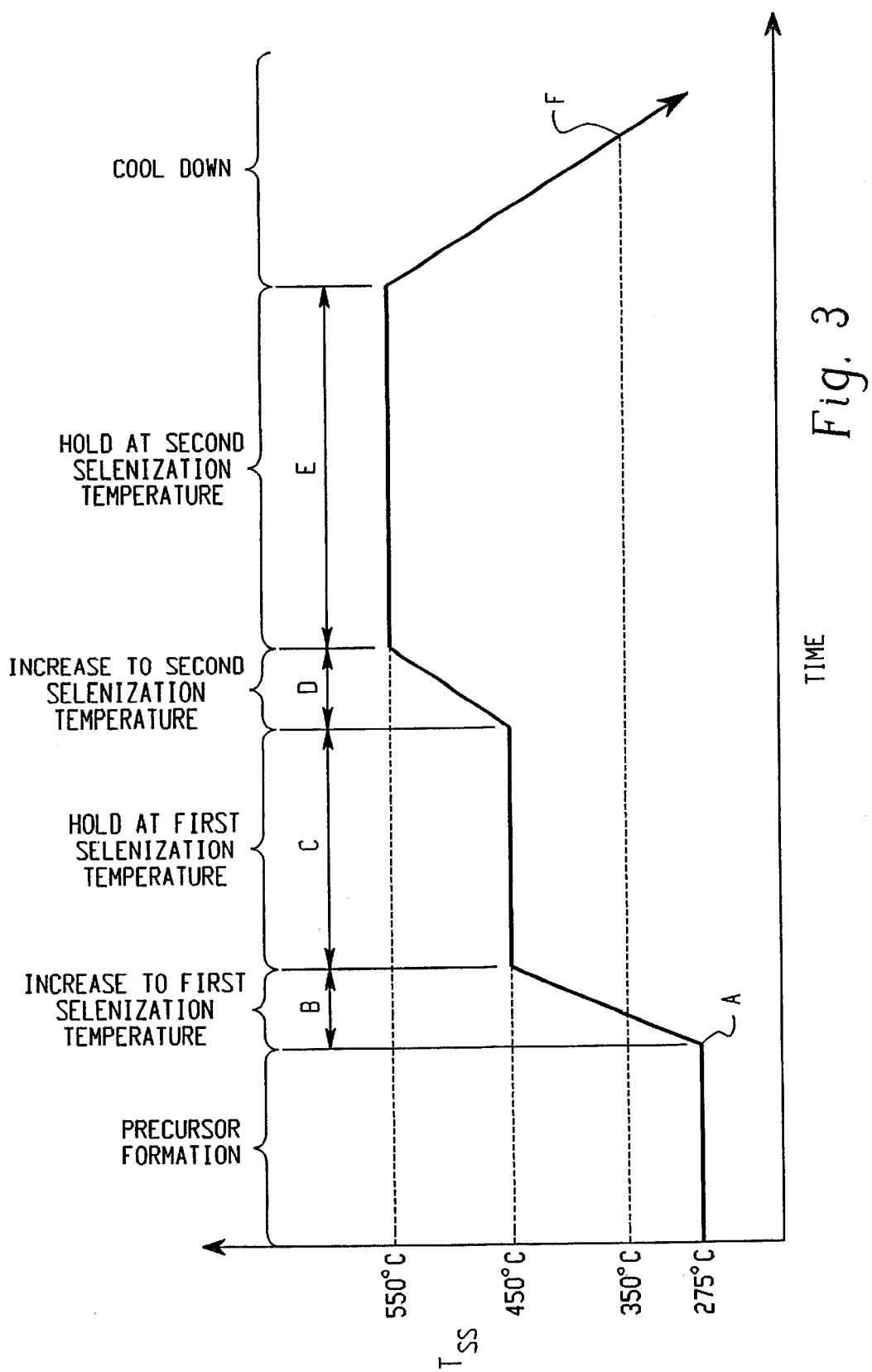
FIG. 3 generalized time-temperature graph for the selenization techniques of the present invention.

In both the indium-gallium removal technique and the copper-top technique, the precursor is heated over a particular temperature profile, a generalization of which is shown in FIG. 3. In both selenizing techniques, the substrate and precursor can remain in the chamber in which the precursor was deposited and the selenization can be performed immediately after the precursor is formed. In both techniques, the precursor is selenized by first heating in a selenium flux at a time and temperature sufficient to cause substantially all of the copper, gallium, and indium in the precursor to react and form whatever compounds they will form and then by heating at a time and different temperature in a selenium flux sufficient to improve the properties of the surface of the absorber layer. Referring now to FIG. 3, the precursor is most preferably formed at about 275° C. At point A, the start of the selenization process, the selenium flux either remains on from the previous precursor deposition step or is turned on to a selenization flux level, and the temperature of the substrate is increased to a first selenization temperature (e.g., most preferably about 450° C.) during a first period of time B. The substrate temperature is held at the first selenization temperature for a second period of time C and then increased to a second selenization temperature (e.g., most preferably about 550° C.) during a third period of time D. The temperature is held at the second selenization temperature for a fourth period of time E and then the substrate heater is turned off. The length of time of each section of the profile varies. In general, the increase to the first selenization temperature and the increase to the second selenization temperature (the first period of time B and the third period of time D) are preferably about three to about four minutes long. In general, the selenium flux remains at about the same value (or at least above a certain value) as the substrate temperature is increased to the first selenization temperature, is held at the first selenization temperature, and is increased to the second selenization temperature (during the first period of time B, second period of time C, and third period of time D). In general, for the indium-gallium removal technique, the selenium flux is gradually decreased from the selenization flux level to zero while the substrate is held at the second selenization temperature (during the fourth period of time E). In general, for the copper-top technique the selenium flux remains at the selenization flux level as the substrate temperature is increased to the first selenization temperature, is held at the first selenization temperature, is increased to the second selenization temperature, and is held at the second selenization temperature (during the first period of time B, second period of time C, third period of time D, and fourth period of time E) and is turned off during the cool down period of time after the substrate temperature cools to below a particular temperature (e.g., about 350° C.). In general, for the copper-top technique the additional copper is preferably added during either while the substrate temperature is held at the first selenization temperature (the second period of time C) or while the substrate temperature is held at the second selenization temperature (during the fourth period of time E), and is more preferably added several minutes into the fourth period of time E.

More specifically for each technique, in the indium-gallium removal technique, the substrate 10 with its associated back contact 14 and precursor 16 are heated from its final precursor deposition temperature to the first selenization temperature during the first period of time B and held at that temperature in a selenium flux having a first selenium flux value for the second period of time C. This allows substantially all of the copper, indium, and gallium in the bulk of the absorber layer to react to form whatever compounds will be formed. Then the substrate 10 with its associated back contact 14 and precursor 16 are heated from the first selenization temperature to the second selenization temperature during the third period of time D and held at that temperature in a selenium flux having a decreasing flux value for the fourth period of time E. This allows the properties of the absorber layer surface to be improved. The first selenization temperature is preferably above about 350° C., more preferably from about 430° C. to about 470° C., even more preferably from about 440° C. to about 460° C., even more preferably from about 445° C. to about 455° C., and most preferably about 450° C. The first selenium flux value is preferably above about 16 Å/s and most preferably about 25 Å/s. The time C the precursor is held at the first selenization temperature is preferably from about 5 to about 10 minutes. The second selenization temperature is preferably from about 475 to about 590° C., more preferably from about 530° C. to about 570° C., even more preferably from about 540° C. to about 560° C., even more preferably from about 545° C. to about 555° C., and most preferably about 550° C. The second selenium flux value is preferably above 16 Å/s and most preferably about 25 Å/s. The time E the precursor is held at the second selenization temperature is preferably about 15 minutes.

The indium-gallium removal selenization technique is preferably performed by heating the substrate 12, bilayer molybdenum film 14, and precursor to about 450° C. during a time period of about three minutes in the presence of an average selenium flux of 25 Å/s; maintaining the temperature of the substrate with its associated formed bilayer molybdenum film and precursor at about 450° C. in the presence of an average selenium flux of 25 Å/s for about 5 to about 10 minutes; heating the substrate with its associated formed bilayer molybdenum film and precursor from about 450° C. to about 550° C. during a time period of about three minutes in the presence of an average selenium flux of 25 Å/s; maintaining the temperature of the substrate with its associated formed bilayer molybdenum film and precursor at about 550° C. for about 15 minutes in the presence of an initial average selenium flux of 25 Å/s while gradually reducing the average selenium flux to no selenium flux after about 10 minutes so that for about the last 5 minutes there is no selenium flux; turning off the substrate heater; and allowing the substrate to cool under vacuum to room temperature.

In general, the copper-top selenization technique is very similar to the indium-gallium removal selenization technique. The substrate 10 with its associated back contact 14 and precursor 16 are heated from its final precursor deposition temperature to the first selenization temperature during the first period of time B and held at that temperature in a selenium flux having a first selenium flux value for the second period of time C. This allows substantially all of the copper, indium, and gallium in the bulk of the absorber layer to react to form whatever compounds will be formed. Then the substrate 10 with its associated back contact 14 and precursor 16 are heated from the first selenization temperature to the second selenization temperature during the third period of time D and held at that temperature in a selenium flux having a second flux value for the fourth period of time E. This allows the properties of the absorber layer surface to be improved. The selenium flux is preferably maintained at about the same level during the entire selenization process, until the substrate cools to about 350° C., point F, at which time the selenium flux is turned off. Also, at some point in time, preferably during the time E the substrate is held at the second selenization temperature, additional copper is deposited. The additional copper is preferably between about 25 and about 75 angstroms of thickness.

During either selenization process, two variables are controlled: substrate temperature and the magnitude of the selenium flux. Although numerous ways of controlling substrate temperature are known to those skilled in the art, for purposes of the examples below a calibrated variac (not shown) was used to control the substrate heater (not shown) during selenization. A thermocouple (not shown) that is in close proximity to the substrate generates a voltage $V_{TSS}$ that is correlated to the temperature of the substrate $T_{SS}$. For purposes of the examples, a $V_{TSS}$ of 7.8 mV indicates that the substrate is about 275° C., a $V_{TSS}$ of 14.0 mV indicates that the substrate is about 450° C., and a $V_{TSS}$ of 19.0 mV indicates that the substrate is about 550° C. In general, for the examples, whenever a temperature change is desired (e.g., from 275° C. to 450° C. or from 450° C. to 550° C.), the variac setting is increased above a level that would keep the substrate at the new desired temperature for a short period of time and then lowered to a level to maintain a relatively steady substrate temperature at the new temperature. Although numerous ways of controlling the magnitude of a selenium flux are known to those skilled in the art, for purposes of the examples below the selenium flux was controlled by altering the current to the selenium source. The selenium flux was measured with the second thickness monitor 62 (FIG. 2b), which was positioned as indicated in Example 1.

Figure 1G:
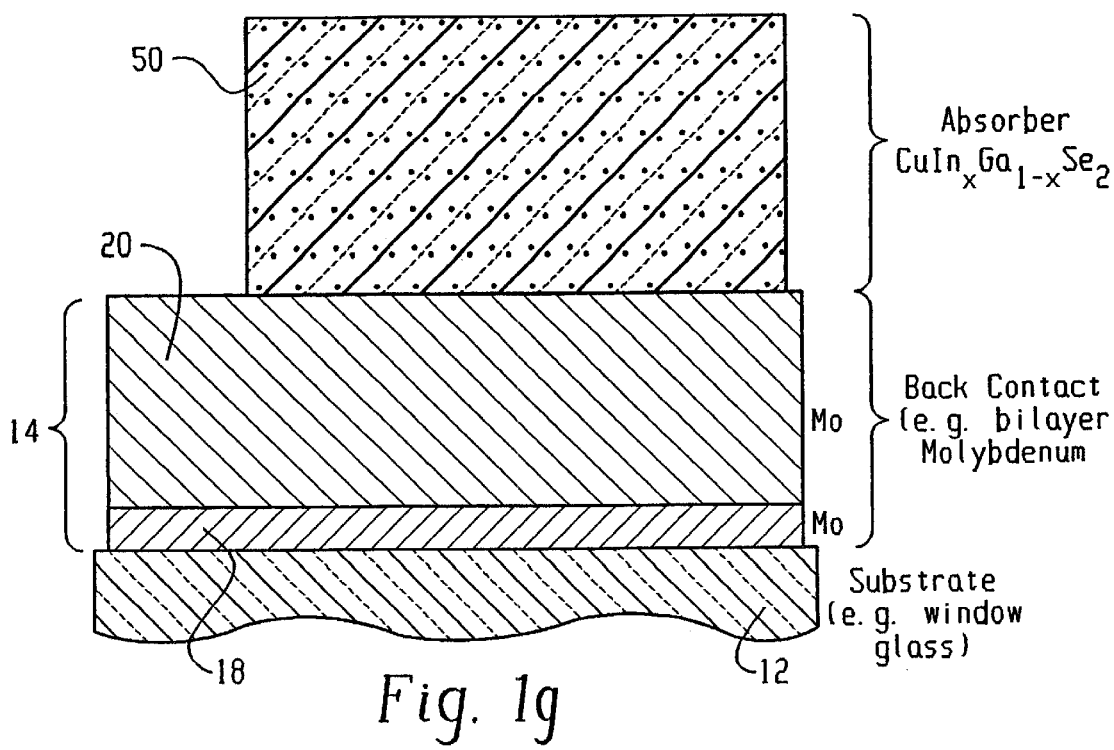

The result of either selenization technique is the formation of a p-type CIGS absorber layer 50 (FIG. 1g).

Figure 1H:
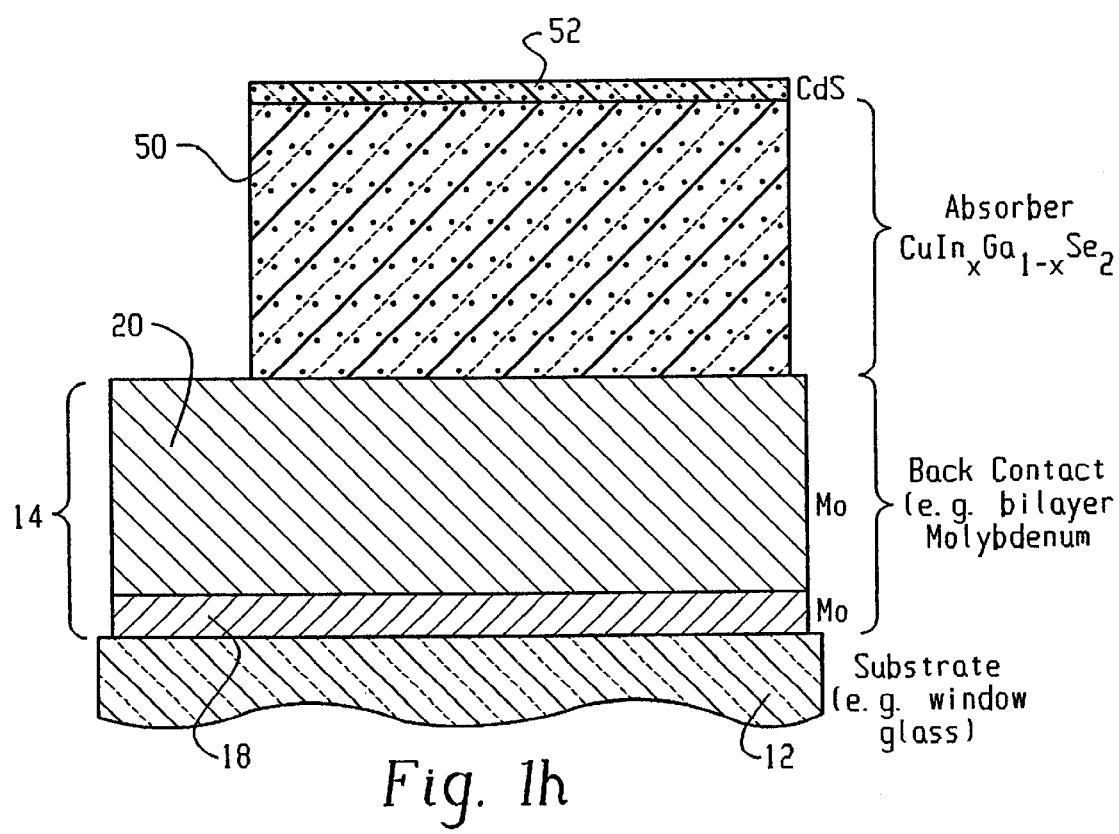

Next, a layer of cadmium sulfide 52 (FIG. 1h) that is about 500 angstroms thick is formed onto the p-type absorber layer 50 in a chemical bath deposition system from a deposition solution composed of a 0.015 molar solution of cadmium acetate, 0.15 molar solution of thiourea, 0.15 molar solution of ammonium hydroxide, and deionized water. This mixture is heated from room temperature until the CdS precipitates onto the absorber layer 50 (about 79° C.).

Figure 1I:
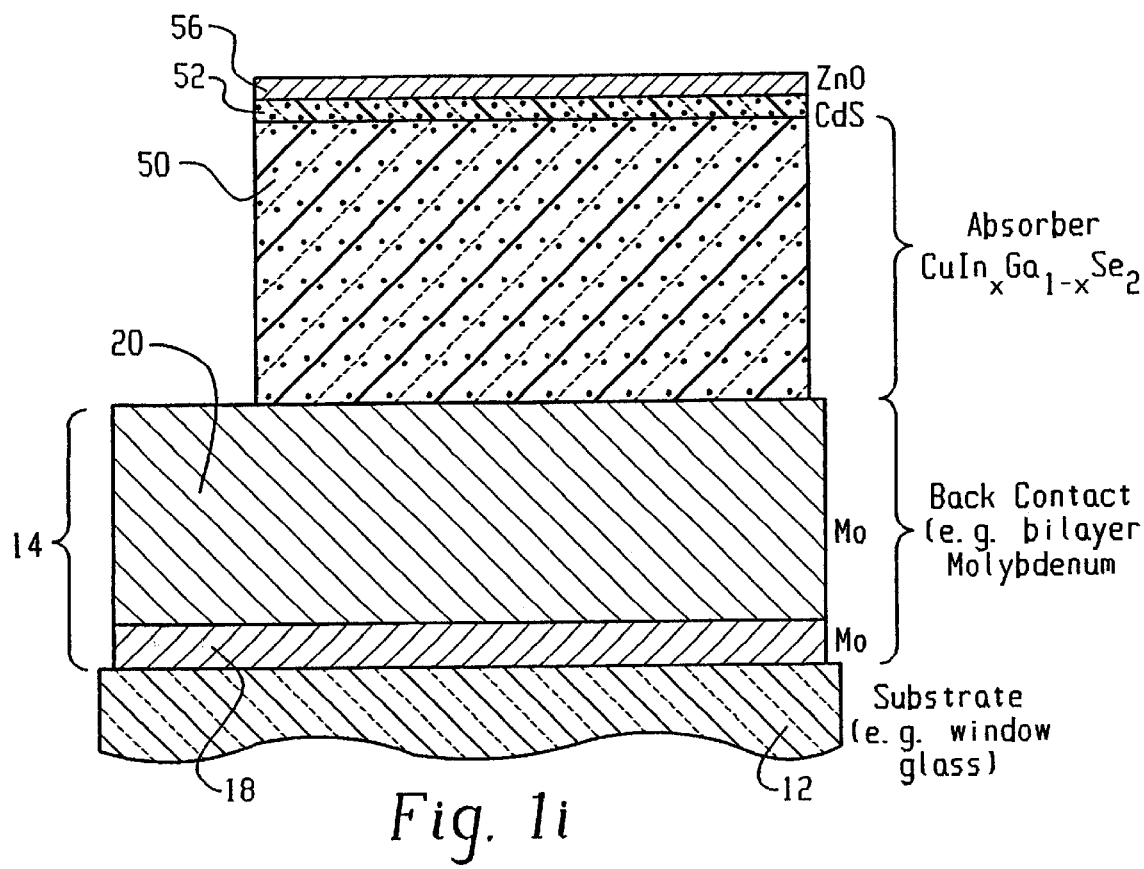
Figure 1J:
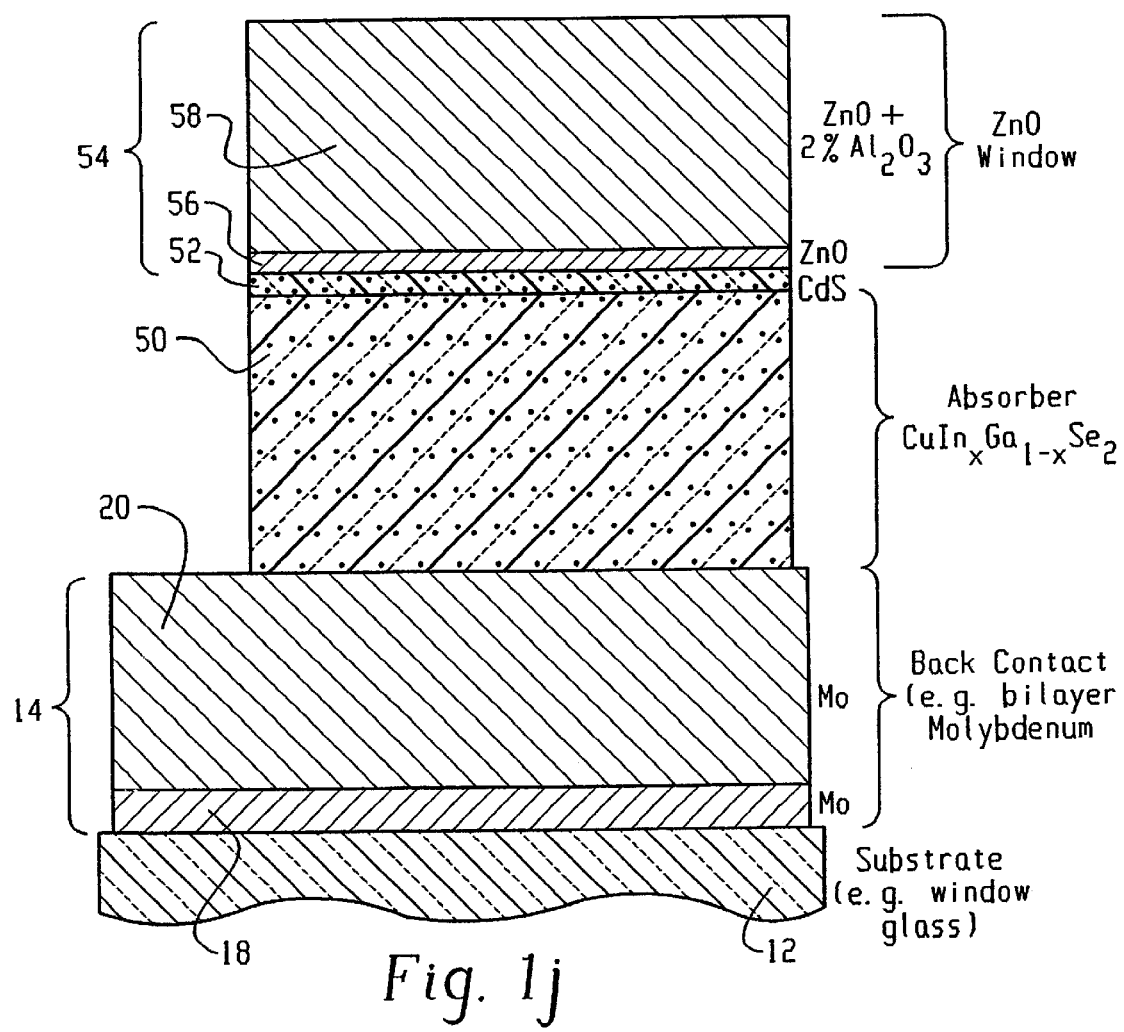

Then a zinc oxide window layer 54 (FIG. 1j) is formed onto the layer of cadmium sulfide 52. With the temperature of the substrate 12 with its associated formed bilayer molybdenum film 14, formed p-type absorber layer 50, and formed layer of cadmium sulfide 52 held at about 125° C.: (i) a layer of intrinsic zinc oxide 56 (FIG. 1i) that is about 600 angstroms thick is RF sputtered from a zinc oxide target onto the layer of cadmium sulfide 52 in an argon gas and oxygen gas atmosphere and (ii) a layer of doped zinc oxide 58 (FIG. 1j) that is about 5000 angstroms thick is RF sputtered from a zinc oxide target with $Al_2O_3$ pieces on it, onto the layer of intrinsic zinc oxide 56 in a pure argon gas atmosphere. In the alternative, a aluminum doped zinc oxide target (about 1% aluminum) can be used as the sputtering target. The doped ZnO layer has a resistivity of about $1 \times 10^{-3}$ Ω-cm.

For devices that are to be used as power sources, an antireflective coating (not shown) is deposited onto the zinc oxide window layer 54, as known to those skilled in the art, to increase the short circuit current of the device.

EXAMPLE 1

(PI Device with Removal Selenization)

The substrate was prepared as follows: a piece of soda-lime glass 10 cm×10 cm in size and 2 mm thick that was free from scratches and other macroscopic defects was selected, washed and scrubbed in a solution of ordinary dishwashing detergent and deionized water (enough to immerse the substrate), rinsed in running deionized tap water to remove soap and contaminants, placed in a substrate holder, re-rinsed while in the holder three times in deionized water, immersed and agitated in an ultrasonic agitator containing trichlorotrifluoroethane for 30 minutes, re-rinsed by suspending in a hot deionized water rinse at a temperature of 90° with nitrogen gas bubbled through the hot water for 45 minutes, with the water being changed after every 15 minutes, and blown dry using dry nitrogen gas.

Next, a bilayer molybdenum film was deposited on the prepared substrate in the DC magnetron sputtering system described above as follows: First, the substrate was placed into the deposition chamber. Then the pressure in the chamber was pumped down to be less than about 5 microTorr and the substrate heater was used to heat the substrate to about 100° C. and held at that temperature for about ten minutes to dry the substrate. The substrate heater was then turned off. With the substrate heater off, a first layer of molybdenum that was about 1200–1300 angstroms thick was deposited onto the prepared substrate at an argon pressure of about 4.5–5.5 milliTorr in the chamber, a sputtering voltage of about 350 volts, a sputtering current of about 650 milliamps, substrate rotation of about 1 revolution per minute, and a deposition time of about 25–27 minutes. The pressure in the chamber was lowered to about 1.5 milliTorr during the last two to three minutes of deposition of the first layer. Deposition was continued at an argon pressure of about 1.5 milliTorr in the chamber, a sputtering voltage of about 400 volts, a sputtering current of about 400 milliamps, substrate rotation of about 1 revolution per minute, and a deposition time of about 135 minutes to deposit a second layer of molybdenum that was about 9000 angstroms thick onto the first layer of molybdenum.

Next, the substrate and its associated bilayer molybdenum film were cut into four pieces that were about 5 centimeters by about 5 centimeters in size and about 2 millimeters thick.

Figure 2A:
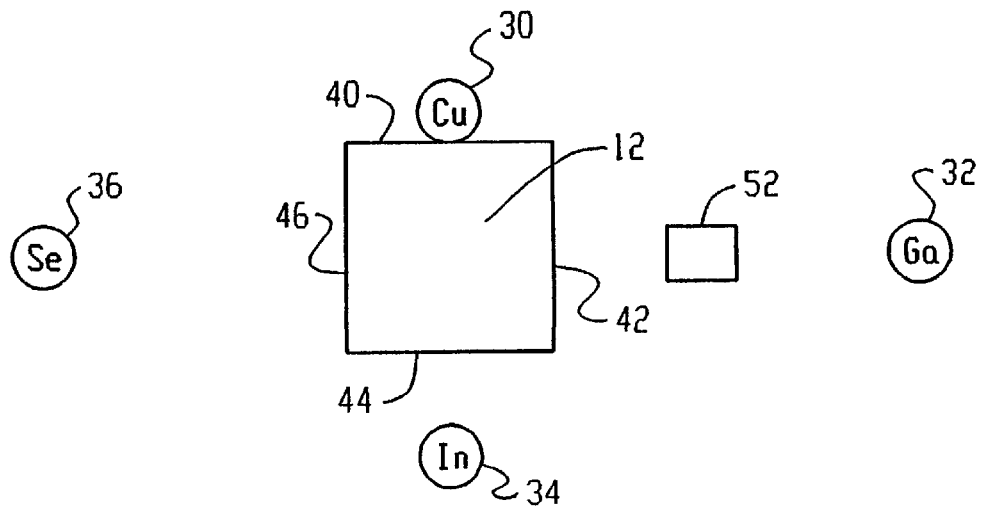
FIGS. 2a and 2b are schematic representations showing top and side views, respectively, of an arrangement of thickness monitors and copper, gallium, indium, and selenium sources during deposition of the precursor and the selenization of the precursor for practicing the embodiments of the method of the present invention presented in the examples.
Figure 2B:
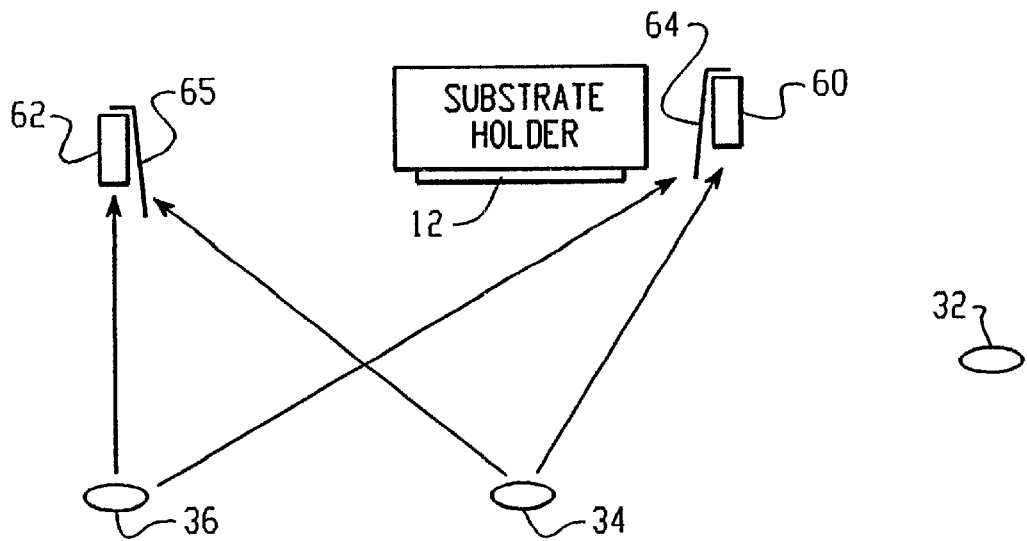

Next, a PI precursor was deposited onto the bilayer molybdenum film. Referring now to FIGS. 2a and 2b, the copper, gallium, indium, and selenium were all deposited in the same vacuum chamber having a copper evaporation unit having a copper source 30, a gallium sputtering unit having a gallium source 32, an indium evaporation unit having an indium source 34, and a selenium evaporation unit having a selenium source 36. The sources were positioned as shown in FIG. 2, which shows schematically a top view of the substrate 12 in relation to the copper source 30, the gallium source 32, the indium source 34, and the selenium source 36. The substrate 12 had a first edge 40, a second edge 42, a third edge 44, and a fourth edge 46. The first edge 40 of the substrate 12 was at the edge of the copper source 30, as illustrated in FIG. 2, thereby creating a copper deposition rate of 2.1 Å/s at the first edge 40 and 1.9 Å/s at the third edge 44. The second edge 42 of the substrate 12 was about 13 centimeters from the center of the gallium source 32, as illustrated in FIG. 2, thereby creating a gallium deposition rate of 0.6 Å/s at the second edge 42 and 0.5 Å/s at the fourth edge 46. The third edge 44 of the substrate 12 was about one centimeter from the edge of the indium source 34, as illustrated in FIG. 2, thereby creating a deposition rate for indium of 3.2 Å/s at the third edge 44 and a deposition rate for indium of 2.8 Å/s at the first edge 40. Thus, the ratio of deposited copper to deposited indium was 1.0 at the first edge 40 and 0.9 at the third edge 44. The fourth edge 46 of the substrate 12 was about 10 centimeters from the edge of the selenium source 36, as illustrated in FIG. 2, thereby creating a selenium deposition rate of 19 Å/s at the fourth edge 46 and 13 Å/s at the second edge 42 (an average selenium flux of 16 Å/s). As indicated in FIG. 2b, the substrate 12 was positioned about 28 centimeters above the copper source 30, the indium source 34, and the selenium source 36, and was positioned 17 centimeters above the gallium source 32.

The gallium sputtering source was a shallow copper container that was made from a standard 3" diameter, 0.25" thick copper sputtering target. To make the container from a sputtering target, a cylindrical depression about 2.7" in diameter and about 0.16" deep was machined into the center of the upper surface of the target. To sputter gallium, the shallow, copper container was provided in accordance with the preceding sentence and placed into the gallium sputter chamber. The gallium sputter bead was leveled by the iterative process described above. More specifically, a small amount of liquid gallium was poured into the shallow container and the sputtering process was started. By repeatedly adjusting the level of the head, then sputtering gallium, and then observing any spilling of or change in location of the gallium, the head was leveled so that the gallium did not move during the sputtering process. With the head level, liquid gallium was then poured into the container to a level to cover the bottom of the container with gallium, but not so high as to allow the liquid gallium to creep up the sides of the container (approximately 60 mg of liquid gallium was poured into the shallow, copper container). With this gallium source, gallium was sputtered in the usual manner, with the parameters set forth below.

Two thickness monitors were used. A first thickness monitor 60 was positioned between the copper, indium, and gallium sources. The gallium sputtering gun used the 3-inch diameter target (liquid gallium in a shallow copper container) described in the paragraph immediately above. The nearest edge of that gun was about 4 inches from the edge of the substrate holder corresponding to edge 42 of the substrate 12. The first thickness monitor 60 was located between the gallium gun and the substrate, i.e., about 2 inches from the edge 42 of the substrate 12. The first thickness monitor 60 was located an equal distance from the copper and indium sources in the other direction. The first thickness monitor 60 was positioned about one inch above the substrate 12 to help shield the first thickness monitor 60 from the selenium source 36. The second thickness monitor 62 was positioned directly over the selenium source 36 at about the same height as the substrate 12. Additional shielding consisting of strategically placed strips of stainless steel sheet 64, 65 were also used to shield the thickness monitors 60, 62. The strip 64 shielded the first thickness monitor 60 from the selenium source 36 and the strip 65 shielded the second thickness monitor 62 from the indium source 34, the copper source 30, and the gallium source 32.

The above arrangement of elemental sources and thickness monitors results in particular gradients for each element. Although not useful in a manufacturing environment (uniform fluxes are used), such gradients were helpful to provide a conversion efficiency distribution across the substrate to aid in selection of a particular combination of thicknesses yielding the best or a desired efficiency in a laboratory setting. The above arrangement of the substrate, sources, and thickness monitors resulted in the following copper thickness distribution (in angstroms) when the first thickness monitor 60 (calibrated for copper) had determined that 1500 angstroms of copper had been deposited:

| | | |
|---|---|---|
| 1680 | 1697 | 1680 |
| 1720 | 1737 | 1720 |
| 1720 | 1764 | 1720 |
| 1695 | 1757 | 1695 |
| 1617 | 1659 | 1617 | where the top row of the above table represents the copper thickness at the first edge 40 of the substrate 12, the right side of the above table represents the copper thickness at the second edge 42 of the substrate 12, the bottom row of the above table represents the copper thickness at the third edge 44 of the substrate 12, and the left column of the above table represents the copper thickness at the fourth edge 46 of the substrate 12. All such tables herein having three columns of five rows are oriented with respect to the substrate 12 in this manner.

Similarly, the above arrangement of the substrate, sources, and thickness monitors resulted in the following gallium thickness distribution (in angstroms) when the first thickness monitor 60 (still calibrated for copper) had determined that 1500 angstroms of gallium had been deposited:

| | | |
|---|---|---|
| 581 | 630 | 680 |
| 585 | 634 | 681 |
| 589 | 637 | 683 |
| 585 | 634 | 681 |
| 581 | 630 | 680 |

Similarly, the above arrangement of the substrate, sources, and thickness monitors resulted in the following indium thickness distribution (in angstroms) when the first thickness monitor 60 (still calibrated for copper) had determined that 4200 angstroms of indium had been deposited:

| | | |
|---|---|---|
| 3806 | 3937 | 4069 |
| 4070 | 4102 | 4135 |
| 4181 | 4214 | 4247 |
| 4310 | 4358 | 4407 |
| 4407 | 4488 | 4569 |

The PI precursor was deposited onto the bilayer molybdenum film as follows. The first thickness monitor was calibrated to measure copper deposition. One of the 5 centimeter by 5 centimeter substrates was positioned in the absorber layer deposition chamber and positioned with respect to the copper, gallium, indium, and selenium sources as described above. Next, the pressure of the chamber was pumped down to less than about 5 microTorr and the temperature of the substrate and precursor was raised to about 305° C. (8.9 mV) with the substrate heater. With the substrate temperature at about 305° C. (8.9 mV), copper was deposited by standard evaporation onto the bilayer molybdenum film at a copper deposition rate of 3.0 Å/s (as measured by the first thickness monitor) until the thickness monitor indicated that 1003 angstroms of copper had been deposited, after which the copper flux was turned off. Argon was then admitted into the chamber to raise the pressure to about 5 milliTorr. With argon flowing into the chamber (31 cc per minute mass flow for argon) and with the substrate heater turned off, gallium was then deposited by sputtering from the shallow copper container containing liquid gallium onto the deposited copper in an argon atmosphere at a gallium deposition rate of 1.2 Å/s as measured by the first thickness monitor) until the first thickness monitor (still calibrated for copper) indicated that 750 angstroms of gallium had been deposited, after which the gallium flux was turned off. The temperature of the substrate fell from about 305° C. (8.9 mV) to about 230° C. (6.1 mV) during the gallium sputtering process. The temperature of the substrate and precursor were then raised to about 275° C. and the argon source was turned off and the chamber pumped back down to less than about 5 microTorr. With the substrate temperature at about 275° C., indium and selenium were then deposited onto the gallium at a deposition rate for indium of about 2.5 Å/s (as measured by the first thickness monitor) and a deposition rate for selenium of about 25 Å/s (as measured by the second thickness monitor) until the first thickness monitor (still calibrated for copper) indicated that about 3450 angstroms of indium had been deposited, after which the indium flux was turned off, and until the second thickness monitor (calibrated for selenium) indicated that about 31,600 angstroms of selenium had been deposited. There was no "crosstalk" registered by the first thickness monitor 60, i.e., with only the selenium evaporator turned on, the first thickness monitor 60 measured no flux (the first thickness monitor was shielded from the selenium source).

Next, the precursor was selenized by leaving the selenium flux on at about 25 Å/s and with the selenium flux on, raising the temperature of the substrate and precursor to about 450° C. over about three minutes, holding the temperature of the substrate and precursor at about 450° C. for about 5 minutes, raising the temperature of the substrate and precursor to about 550° C. over about three minutes, holding the temperature of the substrate and precursor at 550° C. for about 17 minutes, reducing the selenium flux control in two steps so that the selenium flux was lowered after holding for about 6 minutes at about 550 degrees and the selenium flux was turned off after holding for about 11 minutes at about 550 so that during about the last 6 minutes at about 550° C. the selenium flux was turned off. Then the substrate heater was turned off and the substrate was allowed to cool under vacuum (about 5 microTorr) to room temperature. The details of the selenization for this example are shown in Table 1.

TABLE 1

Selenization of Example 1 (PI Precursor with Removal Selenization)

| Time (min) | Variac | $I_{se}$ (A) | $V_{TSS}$ (mV) | $\phi_{Se}$ (Å/S) | $t_{Se}$ (Å) |
|---|---|---|---|---|---|
| 1 | 60 | 16 | 7.8(275° C.) | 24 | 0 |
| 2 | 60 | 15.5 | 10.1 | 24 | 1500 |
| 3 | 60 | 15.5 | 12.4 | 23 | 2800 |
| 4 | 29 | 15.5 | 14.1 (≅450° C.) | 22 | 4100 |
| 5 | 27 | 15.5 | 14.1 (≅450° C.) | 21 | 5400 |
| 6 | 27 | 15.5 | 14.1 (≅450° C.) | 21 | 6700 |
| 7 | 29 | 15.5 | 14.0 (450° C.) | 21 | 8000 |
| 8 | 29 | 15.5 | 13.9 (≅450° C.) | 21 | 9300 |
| 9 | 65 | 15.5 | 13.9 (≅450° C.) | 22 | 10600 |
| 10 | 65 | 15.5 | 15.7 | 22 | 11900 |
| 11 | 65 | 15.5 | 17.5 | 23 | 13300 |
| 12 | 46 | 15.5 | 18.8 (≅550° C.) | 26 | 14800 |
| 13 | 46 | 15.5 | 18.9 (≅550° C.) | 25 | 16400 |
| 14 | 46 | 14.5 | 19.0 (550° C.) | 25 | 17900 |
| 15 | 46 | 14.5 | 19.0 (550° C.) | 27 | 19500 |
| 16 | 46 | 14.5 | 19.0 (550° C.) | 29 | 21200 |
| 17 | 46 | 14.5 | 19.0 (550° C.) | 30 | 23100 |
| 18 | 46 | 10 | 19.0 (550° C.) | 30 | 25000 |
| 19 | 46 | 10 | 19.0 (550° C.) | 30 | 26800 |
| 20 | 46 | 10 | 19.0 (550° C.) | 30 | 28600 |
| 21 | 46 | 10 | 19.0 (550° C.) | 15 | 29500 |
| 22 | 46 | 10 | 19.0 (550° C.) | 15 | 30300 |
| 23 | 46 | 0 | 19.0 (550° C.) | 14 | 31200 |
| 24 | 46 | 0 | 19.0 (550° C.) | 11 | 32000 |
| 25 | 46 | 0 | 19.07 (≅550° C.) | 10 | 32700 |
| 26 | 46 | 0 | 19.09 (≅550° C.) | 11 | 33400 |
| 27 | 46 | 0 | 19.1 (≅550° C.) | 10 | 34000 |
| 28 | 46 | 0 | 19.13 (≅550° C.) | 10 | 34700 |
| 29 | 0 | 0 | 19.14 (≅550° C.) | 10 | 35300 |

Where Time indicates the minutes during the selenization process, Variac indicates the relative position of the variac controlling the magnitude of the substrate heater, $I_{Se}$ indicates the current to the selenium source, $V_{TSS}$ is the calibrated voltage across the thermocouple in close proximity to the substrate 12 and is correlated to the temperature of the substrate, $\phi_{Se}$ is the selenium flux in Å/s, and $t_{Se}$ is the thickness of selenium as indicated by the second flux monitor 62.

Next, a layer of cadmium sulfide about 500 angstroms thick was deposited onto the p-type absorber layer (i.e., onto the selenized precursor) in a chemical bath deposition system as follows. In one 200 cc beaker (beaker #1), a deposition solution composed of 22 cc of a 0.015 molar solution of cadmium acetate, 27.5 cc of a 0.15 molar solution of ammonium hydroxide, and 150 cc of deionized water was prepared. Also, 22 cc of a 0.15 molar solution of thiourea was prepared and set aside. Beaker #1 was immersed in 325 cc of deionized water contained in a large (1000 cc) beaker (beaker #2), which large beaker was heated with a hot plate. When the temperature of beaker #2 reached about 30° C. (in about one minute), the 22 cc of a 0.15 molar solution of thiourea was poured into beaker #1 and then the substrate was placed into beaker #1. The solution temperature of beaker #1 rose to 79 to 81° C. in about 8 to 9 minutes at which time the CdS started precipitating in the solution (turning yellow) and the step was completed. Virtually all the CdS that will precipitate precipitates onto the absorber layer and in the solution virtually instantaneously, which can be identified visually because the solution turns yellow. The above quantities of solutions in beaker #1 result in a layer of CdS grown onto the absorber layer that was about 500 angstroms thick. If thicker CdS is desired, the process must be repeated or the quantities of the solutions in beaker #1 must be altered.

Then, a zinc oxide window layer was deposited onto the cadmium sulfide, as follows. The substrate was placed in the RF sputtering system described above. The substrate was heated to about 125° C. A layer of intrinsic zinc oxide averaging about 600 angstroms thick was RF sputtered from a zinc oxide target (3" diameter) onto the cadmium sulfide in an argon gas and oxygen gas atmosphere using the following parameters: sputtering pressure, 1.5 to 2.5 milliTorr; RF sputtering power, 100 Watts; argon flow, 1.6 cc per minute; oxygen flow, 0.8 cc per minute; deposition time, 20 minutes. Then two small (4 mm×4 mm×1 mm thick) pieces of $Al_2O_3$ were placed onto the zinc oxide target and a layer of doped zinc oxide averaging about 3600 angstroms thick was RF sputtered from the mixed target onto the layer of intrinsic zinc oxide 56 in a pure argon gas atmosphere using the following parameters: sputtering pressure, 1.5 to 2.5 milliTorr; RF sputtering power, 100 Watts; argon flow, 2 cc per minute; deposition time, 120 minutes.

For testing purposes, the zinc oxide window layer was applied with a mask to divide the 5 cm×5 cm substrate into five rows of five columns of sites that are all approximately the same size and are all approximately the same distance from their nearest adjacent sites. Thus, the substrate was effectively divided for testing purposes into twenty-five sites having substantially the same area (the 5 cm×5 cm substrate was divided into five rows and five columns; the "top" row corresponds to the first edge 40, the "right" column corresponds to the second edge 42, the "bottom" row corresponds to the third edge 44, and the "left" column corresponds to the fourth edge 46). The sites are numbered 1–25 (starting in the top left corner and counting down five sites for each column) for reference, with site 1 being in the top-left corner, site 5 being in the bottom-left corner, site 21 being in the top-right corner, and site 25 being in the lower-right corner. The best site for this device was site 3, which had a short circuit current of 0.0338 amperes/cm$^2$, an open circuit voltage of 480 millivolts, a fill factor of 0.63, and a conversion efficiency of 10.2%. Using the deposition thickness values from the thickness monitors for each deposition stage for this example and using the known gradients for each element using the setup described herein, the equivalent thickness of each element deposited for this particular site can be determined. Using these values, it has been determined that for site 3 of this Example a thickness of about 1080 angstroms of copper was deposited onto the back contact, a thickness of about 295 angstroms of gallium was deposited onto the copper, and a thickness of about 3442 angstroms of indium was deposited onto the gallium in the presence of a selenium flux. During the deposition of the indium, a thickness of 31,600 angstroms of selenium was measured by the selenium thickness monitor. During the selenization of the precursor, an additional thickness of 35,300 angstroms of selenium was measured by the selenium thickness monitor. Not all of this selenium was deposited or reacted with the other elements in the precursor/absorber layer; more selenium than necessary was provided so that it would be present where and when needed in the CIGS structure. The above thicknesses result in an atomic ratio for deposited copper to indium of 0.69 in the absorber layer and an atomic ratio of deposited copper to indium and gallium (atomic ratio of deposited copper to Group III elements) of 0.62 in the absorber layer.

EXAMPLE 2

(PI Device with Cu-Top Selenization)

A substrate was prepared in the same manner as Example 1. A bilayer molybdenum film was deposited on the prepared substrate in the same manner as Example 1.

Next, a PI precursor was deposited onto the bilayer molybdenum film as follows. The first thickness monitor was calibrated to measure copper deposition. One of the 5 centimeter by 5 centimeter substrates was positioned in the absorber layer deposition chamber and positioned with respect to the copper, gallium, indium, and selenium sources as described in Example 1. Next, the pressure of the chamber was pumped down to less than about 5 microTorr and the temperature of the substrate and precursor was raised to 275° C. with the substrate heater. With the substrate temperature at 275° C., copper was deposited onto the bilayer molybdenum film at a copper deposition rate of 1.5 Å/s (as measured by the first thickness monitor) (7.5 amperes at 65 volts) until the thickness monitor indicated that 1540 angstroms of copper had been deposited, after which the copper flux was turned off. With the substrate temperature still at 275° C., the substrate heater was turned off and argon was then admitted into the chamber. With the substrate heater off gallium was then deposited by sputtering from the shallow copper container containing liquid gallium onto the deposited copper in an argon atmosphere (pressure of 3.19 milliTorr and a 75 cc per minute mass flow of argon) at a gallium deposition rate of 0.5 Å/s (as measured by the first thickness monitor) (42 milliamperes at the preamplifier) until the first thickness monitor (still calibrated for copper) indicated that 1500 angstroms of gallium had been deposited, after which the gallium flux was turned off. The temperature of the substrate and precursor were then raised to about 275° C. and the argon source was turned off and the chamber pumped back down to less than about 5 microTorr. With the substrate temperature at about 275° C., indium and selenium were then deposited onto the gallium at a deposition rate for indium of 3.0 Å/s (as measured by the first thickness monitor) (5 amperes at 36 volts) and a deposition rate for selenium of 25 Å/s (as measured by the second thickness monitor) (14 amperes at 17 volts) until the first thickness monitor (still calibrated for copper) indicated that 3600 angstroms of indium had been deposited, after which the indium flux was turned off, and until the second thickness monitor (calibrated for selenium) indicated that 33,700 angstroms of selenium had been deposited. There was "crosstalk" of about 0.1 Å/s registered by the first thickness monitor, i.e., with only the selenium source on, the first thickness monitor measured 0.1 Å/s being deposited, even though the first thickness monitor was shielded from the selenium source.

Next, the precursor was selenized by leaving the selenium flux on at about 25 Å/s and with the selenium flux on, raising the temperature of the substrate and precursor to about 450° C. over about three minutes, holding the temperature of the substrate and precursor at about 450° C. for about 8 minutes, raising the temperature of the substrate and precursor to about 550° C. over about four minutes, holding the temperature of the substrate and precursor at 550° C. for about 7 minutes, at which time the heater was turned off. During the 17th minute of selenization (after holding at about 550° C. for about two minutes) additional copper was deposited at a copper deposition rate of 1.5 Å/s (as measured by the first thickness monitor) (7.5 amperes at 65 volts) thickness monitor indicated that an additional 75 angstroms of copper had been deposited, after which the copper flux was turned off again. After the substrate temperature dropped to about 375° C. (in the 29th minute of selenization), the selenium flux control was turned off and the substrate was allowed to cool under vacuum (less than about 5 microTorr) to temperature. The details of the selenization for this example are shown in Table 2.

TABLE 2

Selenization of Example 2 (PI Precursor with Copper-Top Selenization)

| Time (min) | Variac | $I_{se}$ (A) | $V_{TSS}$ (mV) | $\phi_{Se}$ (Å/S) | $t_{Se}$ (Å) |
|---|---|---|---|---|---|
| 0 | 60 | 14 | 7.8 (275° C.) | 22 | 0 |
| 1 | 60 | 14 | 10.5 | 23 | 1300 |
| 2 | 60 | 14 | 12.6 | 24 | 2800 |
| 3 | 25 | 13.5 | 13.8 | 21 | 4100 |
| 4 | 25 | 14.5 | 14.0 (450° C.) | 22 | 5400 |
| 5 | 25 | 14.0 | 14.0 (450° C.) | 24 | 6800 |
| 6 | 25 | 13.5 | 14.0 (450° C.) | 22 | 8300 |
| 7 | 25 | 14.5 | 14.0 (450° C.) | 22 | 9500 |
| 8 | 25 | 14.5 | 14.0 (450° C.) | 24 | 10900 |
| 9 | 25 | 14.0 | 14.0 (450° C.) | 24 | 12400 |
| 10 | 25 | 14.0 | 14.0 (450° C.) | 23 | 13800 |
| 11 | 60 | 14.0 | 14.0 (450° C.) | 22 | 15100 |
| 12 | 60 | 14.0 | 15.6 | 23 | 16500 |

TABLE 2-continued

Selenization of Example 2 (PI Precursor with Copper-Top Selenization)

| Time (min) | Variac | $I_{se}$ (A) | $V_{TSS}$ (mV) | $\phi_{Se}$ (Å/S) | $t_{Se}$ (Å) |
|---|---|---|---|---|---|
| 13 | 60 | 14.0 | 12.3 | 26 | 18000 |
| 14 | 60 | 13.0 | 18.6 | 25 | 19600 |
| 15 | 45 | 13.0 | 19.0 (550° C.) | 25 | 21100 |
| 16 | 45 | 12.5 | 19.0 (550° C.) | 24 | 22500 |
| 17 | 45 | 12.0 | 19.0 (550° C.) | 24 | 24000 |
| 18 | 45 | 13.0 | 19.0 (550° C.) | 23 | 25300 |
| 19 | 45 | 13.5 | 19.0 (550° C.) | 23 | 26700 |
| 20 | 45 | 12.5 | 19.0 (550° C.) | 28 | 28300 |
| 21 | 45 | 12.5 | 19.0 (550° C.) | 25 | 29900 |
| 22 | 0 | 12.0 | 19.0 (550° C.) | 24 | 31300 |
| 23 | 0 | 12.0 | 18.0 | 22 | 32600 |
| 24 | 0 | 12.0 | 16.8 | 24 | 34000 |
| 25 | 0 | 12.5 | 15.7 | 22 | 35400 |
| 26 | 0 | 12.5 | 14.8 | 24 | 36800 |
| 27 | 0 | 12.0 | 14.0 (450° C.) | 25 | 38300 |
| 28 | 0 | 12.0 | 13.2 | 23 | 39700 |
| 29 | 0 | 0 | 12.5 | 4.0 | 40410 |
| 30 | 0 | 0 | 11.9 | 1.4 | 40550 |
| 31 | 0 | 0 | 11.4 | 0.8 | 40610 |
| 32 | 0 | 0 | 10.9 | 0.4 | 40640 |
| 33 | 0 | 0 | 10.5 | 0.2 | 40660 |
| 34 | 0 | 0 | 10.0 | 0.3 | 40670 |
| 35 | 0 | 0 | 9.7 | 0.1 | 40680 |
| 36 | 0 | 0 | 9. | 0.0 | 40680 |

Where Time indicates the minutes during the selenization process, Variac indicates the relative position of the variac controlling the magnitude of the substrate heater, $I_{Se}$ indicates the current to the selenium source, $V_{TSS}$ is the calibrated voltage across the thermocouple in close proximity to the substrate and is correlated to the temperature of the substrate, $\phi_{Se}$ is the selenium flux in Å/s, and $t_{Se}$ is the thickness of selenium as indicated by the second flux monitor 62. A cadmium sulfide layer was deposited onto the absorber layer in the same manner as in Example 1; the CdS precipitated at 78° C. A zinc oxide window layer was deposited in the same manner as in Example 1.

The best site for this device was site 6, which had a short circuit current of 0.0399 amperes/cm², an open circuit voltage of 507 millivolts, a fill factor of 0.64, and a conversion efficiency of 13.0%. Using the deposition thickness values from the thickness monitors for each deposition stage for this example and using the known gradients for each element using the setup described herein, the equivalent thickness of each element deposited for this particular site can be determined. Using these values, it has been determined that for site 6 of this Example a thickness of about 1735 angstroms of copper was deposited onto the back contact, a thickness of about 606 angstroms of gallium was deposited onto the copper, and a thickness of about 3214 angstroms of indium was deposited onto the gallium in the presence of a selenium flux. During the deposition of the indium, a thickness of about 33,700 angstroms of selenium was measured by the selenium thickness monitor. During the selenization of the precursor, an additional thickness of about 85 angstroms of copper was deposited. During the selenization of the precursor, an additional thickness of about 40,680 angstroms of selenium was measured by the selenium thickness monitor. Not all of this selenium was deposited or reacted with the other elements in the precursor/absorber layer, more selenium than necessary was provided so that it would be present where and when needed in the CIGS structure. The above thicknesses result in an atomic ratio for deposited copper to indium of 1.25 in the absorber layer and an atomic ratio of deposited copper to indium and gallium (atomic ratio of deposited copper to Group III elements) of 1.00 in the absorber layer.

EXAMPLE 3

(PII Device with Removal Selenization)

A substrate was prepared in the same manner as Example 1. A bilayer molybdenum film was deposited on the prepared substrate in the same manner as Example 1.

Next, a PII precursor was deposited onto the bilayer molybdenum film as follows. The first thickness monitor was calibrated to measure copper deposition. One of the 5 centimeter by 5 centimeter substrates was positioned in the absorber layer deposition chamber and positioned with respect to the copper, gallium, indium, and selenium sources as described in Example 1. Next, the pressure of the chamber was pumped down to less than about 5 microTorr and the temperature of the substrate and precursor was raised to about 275° C. with the substrate heater. With the substrate temperature at about 275° C., indium and selenium were deposited onto the bilayer molybdenum film at a deposition rate for indium of 2.5 Å/s (as measured by the first thickness monitor) and a deposition rate for selenium of 27 Å/s (as measured by the second thickness monitor) until the first thickness monitor (calibrated for copper) indicated that 3250 angstroms of indium had been deposited, after which the indium flux was turned off, and until the second thickness monitor (calibrated for selenium) indicated that 35,000 angstroms of selenium had been deposited, at which time the selenium flux was turned off. With the substrate temperature at still at 275° C., copper was deposited onto the indium selenide at a copper deposition rate of 3.0 Å/s (as measured by the first thickness monitor) until the thickness monitor (still calibrated for copper) indicated that 1005 angstroms of copper had been deposited, after which the copper flux was turned off. With the substrate temperature still at 275° C., the substrate heater was turned off and argon was then admitted into the chamber. With the substrate heater off gallium was then deposited by sputtering from the shallow copper container containing liquid gallium onto the deposited copper in an argon atmosphere (pressure of about 5 milliTorr) at a gallium deposition rate of 1.2 Å/s (as measured by the first thickness monitor) until the first thickness monitor (still calibrated for copper) indicated that 750 angstroms of gallium had been deposited, after which the gallium flux was turned off. Then the argon source was turned off and the chamber pumped back down to less than about 5 microTorr.

Next, the precursor was selenized by turning the selenium flux on to about 25 Å/s and with the selenium flux on, raising the temperature of the substrate and precursor to about 450° C. over minutes, holding the temperature of the substrate and precursor at about 450° C. for about 7 minutes, raising the temperature of the substrate and precursor to about 550° C. over about four minutes, holding the temperature of the substrate and precursor at 550° C. for about 22 minutes, reducing the selenium flux control in two steps so that the selenium flux was turned off after about 6 minutes at about 550 so that during about the last 16 minutes at about 550° C. the selenium flux was turned off. Then the substrate heater was turned off and the substrate was allowed to cool under vacuum (about 5 microTorr) to room temperature. The details of the selenization for this example are shown in Table 3.

TABLE 3

Selenization of Example 3 (PII Precursor with Removal Selenization)

| Time (min) | Variac | $I_{se}$ (A) | $V_{TSS}$ (mV) | $\phi_{Se}$ (Å/S) | $t_{Se}$ (Å) |
|---|---|---|---|---|---|
| 1 | 60 | 15 | 7.8 (275° C.) | 32 | 0 |
| 2 | 60 | 15 | 10.3 | 29 | 1900 |
| 3 | 60 | 14 | 12.5 | 32 | 3800 |
| 4 | 27 | 14 | 13.9 (≅450° C.) | 30 | 5800 |
| 5 | 27 | 14 | 14.0 (450° C.) | 30 | 7600 |
| 6 | 27 | 14 | 14.0 (450° C.) | 29 | 9400 |
| 7 | 27 | 14 | 14.0 (450° C.) | 36 | 11400 |
| 8 | 27 | 14 | 14.0 (450° C.) | 32 | 13500 |
| 9 | 27 | 12.5 | 14.0 (450° C.) | 34 | 15500 |
| 10 | 27 | 12.5 | 14.0 (450° C.) | 30 | 17400 |
| 11 | 60 | 12.5 | 14.0 (450° C.) | 30 | 19200 |
| 12 | 60 | 12.5 | 15.5 | 31 | 21000 |
| 13 | 60 | 12.5 | 17.1 | 32 | 23000 |
| 14 | 46 | 10 | 18.7 | 32 | 25000 |
| 15 | 46 | 12 | 19.0 (550° C.) | 20 | 26400 |
| 16 | 46 | 12 | 19.1 (≅550° C.) | 23 | 27800 |
| 17 | 46 | 12 | 19.1 (≅550° C.) | 24 | 29300 |
| 18 | 46 | 12 | 19.1 (≅550° C.) | 22 | 30600 |
| 19 | 46 | 12 | 19.1 (≅550° C.) | 16 | — |
| 20 | 46 | 12 | 19.1 (≅550° C.) | 13 | — |
| 21 | 46 | 0 | 19.1 (≅550° C.) | 12 | 33500 |
| — | — | — | — | — | — |
| 37 | 0 | 0 | 19.05 (≅550° C.) | 2 | 36300 |

Where Time indicates the minutes during the selenization process, Variac indicates the relative position of the variac controlling the magnitude of the substrate heater, $I_{Se}$ indicates the current to the selenium source, $V_{TSS}$ is the calibrated voltage across the thermocouple in close proximity to the substrate and is correlated to the temperature of the substrate, $\phi_{Se}$ is the selenium flux in Å/s, and $t_{Se}$ is the thickness of selenium as indicated by the second flux monitor 62.

A cadmium sulfide layer was deposited onto the absorber layer in substantially the same manner as in Example 1. The only difference between the CdS formation in this example and that in example 1 is that the 22 cc of a 0.15 molar solution of thiourea was poured into beaker #1 when the temperature of beaker #2 reached about 50° C. (in about three to four minutes), instead of when the temperature of beaker #2 reached about 30° C., as in the other examples.

The best site for this device was site 6, which had a short circuit current of 0.0257 amperes/cm², an open circuit voltage of 544 millivolts, a fill factor of 0.73, and a conversion efficiency of 10.2%. Using the deposition thickness values from the thickness monitors for each deposition stage for this example and using the known gradients for each element using the setup described herein, the equivalent thickness of each element deposited for this particular site can be determined. Using these values, it has been determined that for site 6 of this Example a thickness of about 3002 angstroms of indium was deposited onto the molybdenum in the presence of a selenium flux, a thickness of about 1132 angstroms of copper was deposited onto the indium selenide, and a thickness of about 303 angstroms of gallium was deposited onto the copper. During the deposition of the indium, a thickness of about 35,000 angstroms of selenium was measured by the selenium thickness monitor. During the selenization of the precursor, an additional thickness of about 33,500 angstroms of selenium was measured by the selenium thickness monitor. Not all of this selenium was deposited or reacted with the other elements in the precursor/absorber layer; more selenium than necessary was provided so that it would be present where and when needed in the CIGS structure. The above thicknesses result in an atomic ratio for deposited copper to indium of 0.83 in the absorber layer and an atomic ratio of deposited copper to indium and gallium (atomic ratio of deposited copper to Group III elements) of 0.73 in the absorber layer.

EXAMPLE 4

(PII Device with Cu-Top Selenization)

A substrate was prepared in the same manner as Example 1. A bilayer molybdenum film was deposited on the prepared substrate in the same manner as Example 1.

Next, a PII precursor was deposited onto the bilayer molybdenum film as follows. The first thickness monitor was calibrated to measure copper deposition. One of the 5 centimeter by 5 centimeter substrates was positioned in the absorber layer deposition chamber and positioned with respect to the copper, gallium, indium, and selenium sources as described in Example 1. Next, the pressure of the chamber was pumped down to less than about 5 microTorr and the temperature of the substrate and precursor was raised to 275° C. with the substrate heater. With the substrate temperature still at 275° C., indium and selenium were then deposited onto the bilayer molybdenum film at a deposition rate for indium of 4.0 Å/s (as measured by the first thickness monitor) (7 amperes at 44 volts) and a deposition rate for selenium of 25 Å/s (as measured by the second thickness monitor) (15 amperes at 19 volts) until the first thickness monitor (calibrated for copper) indicated that 3322 angstroms of indium had been deposited (about 14 minutes), after which the indium flux was turned off, and until the second thickness monitor (calibrated for selenium) indicated that 20,000 angstroms of selenium had been deposited, at which time the selenium flux was turned off. With the substrate temperature still at 275° C., copper was deposited onto the indium selenide at a copper deposition rate of 2.0 Å/s (as measured by the first thickness monitor) (7.5 amperes at 65 volts) until the thickness monitor (still calibrated for copper) indicated that 1500 angstroms of copper had been deposited, after which the copper flux was turned off. With the substrate temperature still at 275° C., the substrate heater was turned off and argon was then admitted into the chamber. With the substrate heater off gallium was then deposited by sputtering from the shallow copper container containing liquid gallium onto the deposited copper in an argon atmosphere (pressure of about 5 milliTorr) at a gallium deposition rate of 1.2 Å/s (as measured by the first thickness monitor) (32 milliamperes at the preamplifier) until the first thickness monitor (still calibrated for copper) indicated that 1500 angstroms of gallium had been deposited, after which the gallium flux was turned off. Then the argon source was turned off and the chamber pumped back down to less than about 5 microTorr.

Next, the precursor was selenized by starting a selenium flux of 25 Å/s, raising the temperature of the substrate and precursor to about 450° C. over about three minutes, holding the temperature of the substrate and precursor at about 450° C. for about 7 minutes, raising the temperature of the substrate and precursor to about 550° C. over about four minutes, holding the temperature of the substrate and precursor at 550° C. for about 8 minutes, at which time the heater was turned off. During the 17th minute of selenization (after holding at about 550° C. for about two minutes) additional copper was deposited at a copper deposition rate of 2.0 Å/s (as measured by the first thickness monitor) (7.5 amperes at 65 volts) until the thickness monitor indicated that an additional 33 angstroms of copper had been deposited, after which the copper flux was turned off again. After the substrate temperature dropped to about 375° C. (in the 28th minute of selenization), the selenium flux control was turned off, a shutter was closed to cover the absorber layer to prevent further selenization of the absorber layer, and the substrate was allowed to cool under vacuum (less than about 5 microTorr) to room temperature. This particular example included the use of new indium and selenium crystals in the thickness monitors. The details of the selenization for this example are shown in Table 4.

TABLE 4

Selenization of Example 4 (PII Precursor with Copper-Top Selenization)

| Time (min) | Variac | $I_{se}$ (A) | $V_{TSS}$ (mV) | $\phi_{Se}$ (Å/S) | $t_{Se}$ (Å) |
|---|---|---|---|---|---|
| 0 | 55 | 17 | 7.8 (275° C.) | 23 | 0 |
| 1 | 55 | 17 | 10.5 | 22 | 1400 |
| 2 | 55 | 16 | 12.6 | 25 | 3000 |
| 3 | 27 | 17 | 13.9 (≅450° C.) | 20 | 4200 |
| 4 | 27 | 16 | 14.0 (450° C.) | 24 | 5500 |
| 5 | 27 | 16 | 14.0 (450° C.) | 24 | 7000 |
| 6 | 27 | 16 | 14.0 (450° C.) | 23 | 8300 |
| 7 | 27 | 16 | 14.0 (450° C.) | 24 | 9700 |
| 8 | 27 | 16 | 14.0 (450° C.) | 25 | 11200 |
| 9 | 27 | 15 | 14.0 (450° C.) | 25 | 12700 |
| 10 | 55 | 15 | 14.0 (450° C.) | 25 | 14200 |
| 11 | 55 | 15 | 15.4 | 24 | 15600 |
| 12 | 55 | 14 | 16.8 | 26 | 17000 |
| 13 | 55 | 13 | 18.0 | 27 | 18600 |
| 14 | 45 | 13 | 18.9 (≅550° C.) | 25 | 20200 |
| 15 | 45 | 13 | 19.0 (550° C.) | 25 | 21700 |
| 16 | 45 | 13 | 19.1 (≅550° C.) | 23 | 23200 |
| 17 | 45 | 13 | 19.1 (≅550° C.) | 23 | 23200 |
| 18 | 45 | 13 | 19.1 (≅550° C.) | 23 | 23200 |
| 19 | 45 | 13 | 19.1 (≅550° C.) | 20 | 26800 |
| 20 | 45 | 13 | 19.1 (≅550° C.) | 20 | 26800 |
| 21 | 45 | 13 | 19.1 (≅550° C.) | 23 | 29600 |
| 22 | 0 | 13 | 19.2 (≅550° C.) | 22 | 30900 |
| 23 | 0 | 13 | 18.0 | 24 | 32300 |
| 24 | 0 | 13 | 16.8 | 24 | 33800 |
| 25 | 0 | 13 | 15.7 | 21 | 35100 |
| 26 | 0 | 13 | 14.8 | 21 | 36300 |
| 27 | 0 | 13 | 13.9 | 19 | 37500 |
| 28 | 0 | 0 | 13.2 | 20 | 38700 |

Where Time indicates the minutes during the selenization process, Variac indicates the relative position of the variac of the substrate heater, $I_{Se}$ indicates the current to the selenium source, $V_{TSS}$ is the calibrated voltage across the thermocouple in close proximity to the substrate and is correlated to the temperature of the substrate, $\phi_{Se}$ is the selenium flux in Å/s, and $t_{Se}$ is the thickness of selenium as indicated by the second flux monitor 62.

A cadmium sulfide layer was deposited onto the absorber layer in the same manner as in Example 1; the CdS precipitated at 77° C. A zinc oxide window layer was deposited in the same manner as in Example 1.

The best site for this device was site 4, which had a short circuit current of 0.0288 amperes/cm$^2$, an open circuit voltage of 535 millivolts, a fill factor of 0.65, and a conversion efficiency of 10.0%. Using the deposition thickness values from the thickness monitors for each deposition stage for this example and using the known gradients for each element using the setup described herein, the equivalent thickness of each element deposited for this particular site can be determined. Using these values, it has been determined that for site 4 of this Example a thickness of about 3331 angstroms of indium was deposited onto the molybdenum in the presence of a selenium flux, a thickness of about 1569 angstroms of copper was deposited onto the indium selenide, and a thickness of about 585 angstroms of gallium was deposited onto the copper. During the deposition of the indium, a thickness of about 20,000 angstroms of selenium was measured by the selenium thickness monitor. During the selenization of the precursor, an additional thickness of about 35 angstroms of copper was deposited. During the selenization of the precursor, an additional thickness of about 38,700 angstroms of selenium was measured by the selenium thickness monitor. Not all of this selenium was deposited or reacted with the other elements in the precursor/absorber layer; more selenium than necessary was provided so that it would be present where and when needed in the CIGS structure. The above thicknesses result in an atomic ratio for deposited copper to indium of 1.06 in the absorber layer and an atomic ratio of deposited copper to indium and gallium (atomic ratio of deposited copper to Group III elements) of 0.86 in the absorber layer.

Using the photovoltaic devices of the present invention is very straightforward and known to those skilled in the art. In short, leads (not shown) are attached to the back contact 14 and the zinc oxide window 54 and the device is illuminated. As known to those in the art, an antireflective coating (not shown) is typically added to increase the short circuit current of the device.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. For example, the addition of more copper during selenization according to the present invention may provide advantages when used with prior art selenization with H$_2$Se gas. Accordingly, departures may be made from such details without departing from the spirit or scope of the applicant's general inventive concept.

What is claimed is:

1. A method of manufacturing a thin film photovoltaic device comprising the steps of:

(a) providing a substrate carrying a back contact;

(b) forming a precursor on the back contact by depositing at least one Class IB element, at least one Class IIIA element, and at least one Class VIA element on the back contact, with an atomic ratio of deposited Class IB elements to deposited Class IIIA elements in the precursor of not greater than 1.0;

(c) heating the precursor in the presence of a flux of at least one Class VIA element thereby creating a partially completed absorber layer;

(d) depositing an additional amount of at least one Class IB element onto the partially completed absorber layer, thereby changing the atomic ratio of deposited Class IB elements to deposited Class IIIA elements; and (e) heating the partially completed absorber layer with its additional amount of Class IB element in the presence of a flux of at least one Class VIA element.

2. A method according to claim 1 wherein said step (c) comprises the steps of:

(1) heating the precursor at a first temperature in the presence of a flux of at least one Class VIA element; and (2) heating the precursor at a second temperature higher than the first temperature in the presence of a flux of at least one Class VIA element; and wherein said steps (d) and (e) are performed with the partially completed absorber layer at the second temperature.

3. A method according to claim 1 wherein said step (d) comprises depositing the additional amount of Class IB element until the atomic ratio of deposited Class IB elements to deposited Class IIIA elements is about 1.0.

4. A method according to claim 1 wherein said step (a) comprises the steps of:
   (1) depositing a first layer of molybdenum onto the substrate at a first pressure; and
   (2) depositing a second layer of molybdenum onto the first layer of molybdenum at a second pressure that is substantially lower than the first pressure.

5. A method according to claim 4 wherein said first pressure is about 5 milliTorr and said second pressure is about 1.5 milliTorr.

6. A method according to claim 1 wherein said step (b) comprises the steps of:
   (1) first depositing the at least one Class IB element onto the back contact;
   (2) then depositing a first Class IIIA element onto the at least one Class IB element; and
   (3) then depositing a second Class IIIA element in the presence of a flux of the at least one Class VIA element onto the first Class IIIA element that was deposited onto the at least one Class IB element.

7. A method according to claim 6 wherein said at least one Class IB element comprises copper, wherein said first Class IIIA element comprises gallium, wherein said second Class IIIA element comprises indium, and wherein said at least one Class VIA element comprises selenium.

8. A method according to claim 6 wherein said step (3) comprises depositing the second Class IIIA element in the presence of the flux of the Class VIA element until the atomic ratio of the deposited Class IB element to the deposited Class IIIA elements in the precursor is from about 0.8 to about 1.0, but not greater than 1.0.

9. A method according to claim 6 wherein said step (3) comprises depositing the second Class IIIA element in the presence of the flux of the Class VIA element until the atomic ratio of the deposited Class IB element to the deposited Class IIIA elements in the precursor is from about 0.9 to about 1.0, but not greater than 1.0.

10. A method according to claim 6 wherein said step (3) comprises depositing the second Class IIIA element via a flux of the second Class IIIA element in the presence of the flux of the Class VIA element and wherein the magnitude in angstroms per second of the flux of the Class IB element is greater than two times the magnitude in angstroms per second of the flux of the second Class IIIA element.

11. A method according to claim 6 wherein said step (3) comprises depositing the second Class IIIA element via a flux of the second Class IIIA element in the presence of the flux of the Class VIA element and wherein the magnitude in angstroms per second of the flux of the Class IB element is greater than three times the magnitude in angstroms per second of the flux of the second Class IIIA element.

12. A method according to claim 6 wherein said step (3) comprises depositing the second Class IIIA element via a flux of the second Class IIIA element in the presence of the flux of the Class VIA element and wherein the magnitude of the flux of the Class IB element is about five times the magnitude of the flux of the second Class IIIA element.

13. A method according to claim 6 wherein said steps (1) and (3) are performed with the substrate at about 275° C.

14. A method according to claim 6 wherein said step (c) comprises the steps of:
   (1) heating the precursor at a first temperature in the presence of a flux of at least one Class VIA element; and
   (2) heating the precursor at a second temperature higher than the first temperature in the presence of a flux of at least one Class VIA element; and
   wherein said steps (d) and (e) are performed with the partially completed absorber layer at the second temperature.

15. A product made by the process of claim 6.

16. A method according to claim 1 wherein said step (b) comprises the steps of:
   (1) first depositing a first Class IIIA element in the presence of a flux of the at least one Class VIA element onto the back contact;
   (2) then depositing the at least one Class IB element onto the first Class IIIA element that was deposited in the presence of a flux of at least one Class VIA element;
   (3) then depositing a second Class IIIA element onto the at least one Class IB element.

17. A method according to claim 16 wherein said step (2) comprises depositing the Class IB element until the atomic ratio of the deposited Class IB element to the deposited Class IIIA elements in the precursor is from about 0.8 to about 1.0, but not greater than 1.0.

18. A method according to claim 16 wherein said step (2) comprises depositing the Class IB element until the atomic ratio of the deposited Class IB element to the deposited Class IIIA elements in the precursor is from about 0.9 to about 1.0, but not greater than 1.0.

19. A method according to claim 16 wherein said step (1) comprises depositing the second Class IIIA element via a flux of the second Class IIIA element in the presence of the flux of the Class VIA element and wherein the magnitude in angstroms per second of the flux of the Class IB element is greater than two times the magnitude in angstroms per second of the flux of the first Class IIIA element.

20. A method according to claim 16 wherein said step (1) comprises depositing the second Class IIIA element via a flux of the second Class IIIA element in the presence of the flux of the Class VIA element and wherein the magnitude in angstroms per second of the flux of the Class IB element is greater than three times the magnitude in angstroms per second of the flux of the first Class IIIA element.

21. A method according to claim 16 wherein said step (1) comprises depositing the second Class IIIA element via a flux of the second Class IIIA element in the presence of the flux of the Class VIA element and wherein the magnitude in angstroms per second of the flux of the Class IB element is about five times the magnitude in angstroms per second of the flux of the first Class IIIA element.

22. A method according to claim 16 wherein said steps (1) and (2) are performed with the substrate at about 275° C.

23. A method according to claim 16 wherein said at least one Class IB element comprises copper, wherein said first Class IIIA element comprises indium, wherein said second Class IIIA element comprises gallium, and wherein said at least one Class VIA element comprises selenium.

24. A product made by the process of claim 16.

25. A method of manufacturing a thin film photovoltaic device comprising the steps of:
   (a) providing a substrate carrying a back contact;
   (b) forming a precursor on the back contact by:
      (1) first depositing copper onto the back contact while the substrate is at about 275° C.;
      (2) then depositing gallium onto the deposited copper; and
      (3) then depositing indium in the presence of a selenium flux onto the deposited gallium while the substrate is at about 275° C. until the atomic ratio of deposited copper to deposited indium and gallium is less than 1.0;

(c) heating the precursor in the presence of a selenium flux to a temperature substantially higher than 275° C.

26. A method of manufacturing a thin film photovoltaic device comprising the steps of:

(a) providing a substrate carrying a back contact;

(b) forming a precursor on the back contact by:

(1) first depositing indium in the presence of a selenium flux onto the back contact while the substrate is at about 275° C.;

(2) then depositing copper onto the indium deposited in the presence of a selenium flux while the substrate is at about 275° C.; and (3) then depositing gallium onto the deposited copper until the atomic ratio of deposited copper to deposited indium and gallium is less than 1.0;

(c) heating the precursor in the presence of a selenium flux to a temperature substantially higher than 275° C.

27. A method of manufacturing a thin film photovoltaic device comprising the steps of:

(a) providing a substrate carrying a back contact;

(b) forming a precursor on the back contact by:

(1) first depositing copper onto the back contact while the substrate is at about 275° C.;

(2) then depositing gallium onto the deposited copper; and (3) then depositing indium in the presence of a selenium flux onto the deposited gallium while the substrate is at about 275° C. until the atomic ratio of deposited copper to deposited indium and gallium is less than 1.0;

(c) heating the precursor in the presence of a selenium flux thereby creating a partially completed absorber layer;

(d) depositing an additional amount copper onto the partially completed absorber layer, thereby changing the atomic ratio of deposited copper to deposited indium and gallium; and (e) heating the partially completed absorber layer with its additional amount copper in the presence of a selenium flux.

28. A method of manufacturing a thin film photovoltaic device comprising the steps of:

(a) providing a substrate carrying a back contact;

(b) forming a precursor on the back contact by:

(1) first depositing indium in the presence of a selenium flux onto the back contact while the substrate is at about 275° C.;

(2) then depositing copper onto the indium deposited in the presence of a selenium flux while the substrate is at about 275° C.; and (3) then depositing gallium onto the deposited copper until the atomic ratio of deposited copper to deposited indium and gallium is less than 1.0;

(c) heating the precursor in the presence of a selenium flux thereby creating a partially completed absorber layer;

(d) depositing an additional amount copper onto the partially completed absorber layer, thereby changing the atomic ratio of deposited copper to deposited indium and gallium; and (e) heating the partially completed absorber layer with its additional amount copper in the presence of a selenium flux.

29. A method of manufacturing a thin film photovoltaic device comprising the steps of:

(a) providing a substrate carrying a back contact;

(b) forming a precursor on the back contact by:

(1) first depositing copper onto the back contact while the substrate is at about 275° C.;

(2) then depositing gallium onto the deposited copper;

(3) then depositing indium in the presence of a selenium flux onto the deposited gallium while the substrate is at about 275° C.;

(4) then depositing copper onto the indium deposited in the presence of a selenium flux while the substrate is at about 275° C.;

(5) then depositing gallium onto the deposited copper; and (6) then depositing indium in the presence of a selenium flux onto the deposited gallium while the substrate is at about 275° C.; and (c) heating the precursor in the presence of a selenium flux to a temperature substantially higher than 275° C.

30. A method of manufacturing a thin film photovoltaic device according to claim 25 wherein said step (c) comprises the steps of:

(1) heating the precursor in the presence of a selenium flux thereby creating a partially completed absorber layer;

(2) depositing an additional amount of copper onto the partially completed absorber layer, thereby changing the atomic ratio of deposited copper to deposited indium and gallium; and (3) heating the partially completed absorber layer with its additional amount of copper in the presence of a selenium flux.

31. A product/according to claim 29, further characterized by having been made by the process of claim 30.

32. A product made by the process of claim 29.

33. A method of manufacturing a thin film photovoltaic device comprising the steps of:

(a) providing a substrate carrying a back contact;

(b) forming a precursor on the back contact by:

(1) first depositing indium in the presence of a selenium flux onto the back contact while the substrate is at about 275° C.;

(2) then depositing copper onto the indium deposited in the presence of a selenium flux while the substrate is at about 275° C.;

(3) then depositing gallium onto the deposited copper, (4) then depositing indium in the presence of a selenium flux onto the deposited gallium while the substrate is at about 275° C.;

(5) then depositing copper onto the indium deposited in the presence of a selenium flux while the substrate is at about 275° C.; and (6) then depositing gallium onto the deposited copper;

(c) heating the precursor in the presence of a selenium flux to a temperature substantially higher than 275° C.

34. A product made by the process of claim 33.

35. A method of manufacturing a thin film photovoltaic device according to claim 33 wherein said step (c) comprises the steps of:

(1) heating the precursor in the presence of a selenium flux thereby creating a partially completed absorber layer;

(2) depositing an additional amount of copper onto the partially completed absorber layer, thereby changing the atomic ratio of deposited copper to deposited indium and gallium; and (3) heating the partially completed absorber layer with its additional amount of copper in the presence of a selenium flux.

36. A product/according to claim 33, further characterized by having been made by the process of claim 35.

* * * * *

UNITED STATES PATENT AND TRADEMARK OFFICE
CERTIFICATE OF CORRECTION

PATENT NO. : 6,258,620 B1
DATED : July 10, 2001
INVENTOR(S) : Don Louis Morel and Syed Arif Zafar Page 1 of 1

It is certified that error appears in the above-identified patent and that said Letters Patent is hereby corrected as shown below:

Claim 31,
After "product" please delete "/according to claim 33, further characterized by having been".

Claim 36,
After "product" please delete "/according to claim 33, further characterized by having been".

Signed and Sealed this

Twenty-seventh Day of November, 2001

Attest:

NICHOLAS P. GODICI
Attesting Officer
Acting Director of the United States Patent and Trademark Office

UNITED STATES PATENT AND TRADEMARK OFFICE
CERTIFICATE OF CORRECTION

PATENT NO.   : 6,258,620 B1                                    Page 1 of 1
DATED        : July 10, 2001
INVENTOR(S)  : Don Louis Morel and Syed Arif Zafar It is certified that error appears in the above-identified patent and that said Letters Patent is hereby corrected as shown below:

<u>Column 1,</u>
Line 5, after "Oct. 15, 1997." please insert -- This invention was made with government support under NREL subcontract number XAF-5-14142-09, prime contract no. DE-AC36-83CH10093 awarded by the Department of Energy. The Government has certain rights in this invention. --

Signed and Sealed this

Fifth Day of March, 2002

*Attest:*

JAMES E. ROGAN
*Director of the United States Patent and Trademark Office*

*Attesting Officer*